(12) United States Patent
Nam et al.

(10) Patent No.: US 12,490,468 B2
(45) Date of Patent: Dec. 2, 2025

(54) SEMICONDUCTOR DEVICE INCLUDING SINGLE-CRYSTALLINE SILICON OXIDE BARRIER PATTERN

(71) Applicant: Samsung Electronics Co., Ltd., Suwon-si (KR)

(72) Inventors: Yongjun Nam, Suwon-si (KR); Sangmoon Lee, Suwon-si (KR); Jinbum Kim, Suwon-si (KR); Hyojin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/112,122

(22) Filed: Feb. 21, 2023

(65) Prior Publication Data

US 2023/0411487 A1  Dec. 21, 2023

(30) Foreign Application Priority Data

Jun. 21, 2022  (KR) ........................ 10-2022-0075807

(51) Int. Cl.
  *H10D 30/67* (2025.01)
  *H10D 30/01* (2025.01)
  *H10D 30/43* (2025.01)
  *H10D 62/13* (2025.01)

(52) U.S. Cl.
  CPC ....... *H10D 30/6739* (2025.01); *H10D 30/014* (2025.01); *H10D 30/031* (2025.01); *H10D 30/43* (2025.01); *H10D 30/6735* (2025.01); *H10D 62/151* (2025.01)

(58) Field of Classification Search
  CPC .............. H10D 30/43; H10D 30/6735; H10D 30/6739; H10D 30/014; H10D 30/031
  See application file for complete search history.

(56) References Cited

U.S. PATENT DOCUMENTS

| 9,406,753 | B2 | 8/2016 | Mears et al. | |
| 9,941,359 | B2 | 4/2018 | Mears et al. | |
| 9,972,685 | B2 | 5/2018 | Mears et al. | |
| 10,211,322 | B1* | 2/2019 | Kim ..................... | B82Y 10/00 |
| 10,263,100 | B1 | 4/2019 | Bi et al. | |
| 10,453,945 | B2 | 10/2019 | Mears et al. | |
| 10,840,336 | B2 | 11/2020 | Connelly et al. | |

(Continued)

FOREIGN PATENT DOCUMENTS

| KR | 1020200009474 A | 1/2020 |
| KR | 1020210000780 A | 1/2021 |

*Primary Examiner* — Davienne N Monbleau
*Assistant Examiner* — Emily Farmer
(74) *Attorney, Agent, or Firm* — Muir Patent Law, PLLC

(57) ABSTRACT

A semiconductor device may include a substrate including an active pattern, a channel pattern on the active pattern, the channel pattern including a plurality of semiconductor patterns, which are vertically stacked to be spaced apart from each other, a source/drain pattern connected to the plurality of semiconductor patterns, a gate electrode including a plurality of gate electrode portions, a gate electrode portion interposed between adjacent ones of the semiconductor patterns, and a plurality of barrier patterns each comprising an epitaxial layer including single-crystalline silicon oxide. A barrier pattern interposed between each of the adjacent ones of the semiconductor patterns and a respective gate electrode portion.

20 Claims, 26 Drawing Sheets

(56) References Cited

U.S. PATENT DOCUMENTS

| | | |
|---|---|---|
| 10,847,618 B2 | 11/2020 | Takeuchi et al. |
| 10,879,394 B2 | 12/2020 | Yeh et al. |
| 11,094,832 B2 | 8/2021 | Kim et al. |
| 2016/0336406 A1* | 11/2016 | Mears ................... H10D 30/673 |
| 2020/0411698 A1* | 12/2020 | Kim ................... H10D 30/6757 |
| 2022/0028994 A1* | 1/2022 | Chen ................... H01L 21/7806 |

* cited by examiner

SEMICONDUCTOR DEVICE INCLUDING SINGLE-CRYSTALLINE SILICON OXIDE BARRIER PATTERN

CROSS-REFERENCE TO RELATED APPLICATIONS

This U.S. non-provisional patent application claims priority under 35 U.S.C. § 119 to Korean Patent Application No. 10-2022-0075807, filed on Jun. 21, 2022, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor and a method of fabricating the same.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize semiconductor devices with high performance.

SUMMARY

An embodiment of the inventive concept provides a semiconductor device with improved reliability and electric characteristics.

An embodiment of the inventive concept provides a semiconductor device that can be fabricated with improved process efficiency.

According to an embodiment of the inventive concept, a semiconductor device may include a substrate including an active pattern, a channel pattern on the active pattern, the channel pattern including a plurality of semiconductor patterns, which are vertically stacked to be spaced apart from each other, a source/drain pattern connected to the plurality of semiconductor patterns, a gate electrode including a plurality of gate electrode portions, a gate electrode portion interposed between adjacent ones of the semiconductor patterns, and a plurality of barrier patterns each comprising an epitaxial layer including single-crystalline silicon oxide, wherein a barrier pattern is interposed between each of the adjacent ones of the semiconductor patterns and a respective gate electrode portion.

According to an embodiment of the inventive concept, a semiconductor device may include a substrate including an active pattern, a channel pattern on the active pattern, the channel pattern including a plurality of semiconductor patterns, which are vertically stacked to be spaced apart from each other, a source/drain pattern connected to the plurality of semiconductor patterns, a gate electrode including a plurality of gate electrode portions, a gate electrode portion interposed between adjacent ones of the semiconductor patterns and a plurality of barrier patterns each comprising an epitaxial layer including single-crystalline silicon oxide, wherein a barrier pattern is interposed between each of the adjacent ones of the semiconductor patterns and a respective gate electrode portion, wherein each of the plurality of barrier patterns comprise silicon oxide, wherein an oxygen concentration of the silicon oxide has a value selected from a range between 7.0E18 atoms/cm$^3$ and 1.3E19 atoms/cm$^3$, and wherein a thickness of each of the plurality of barrier patterns has a value selected from a range between 30 Å and 40 Å.

According to an embodiment of the inventive concept, a semiconductor device may include a substrate including an active region, a device isolation layer defining an active pattern on the active region, a channel pattern and a source/drain pattern on the active pattern, the channel pattern including a plurality of semiconductor patterns, which are vertically stacked to be spaced apart from each other, a gate electrode on the semiconductor patterns, the gate electrode including a first portion, which is provided below the uppermost one of the semiconductor patterns, and a second portion, which is provided on the uppermost one of the semiconductor patterns, a first barrier pattern between the uppermost one of the semiconductor patterns and the first portion, a gate insulating layer between the uppermost one of the semiconductor patterns and the second portion, an inner spacer between the first portion and the source/drain pattern, a gate spacer on a side surface of the second portion, a gate capping pattern on a top surface of the gate electrode, an interlayer insulating layer on the gate capping pattern, an active contact provided to penetrate the interlayer insulating layer and electrically connected to the source/drain pattern, a metal-semiconductor compound layer interposed between the active contact and the source/drain pattern, a gate contact provided to penetrate the interlayer insulating layer and the gate capping pattern and electrically connected to the gate electrode, a first metal layer on the interlayer insulating layer, the first metal layer including first interconnection lines, which are electrically and respectively connected to the active and gate contacts, and a power line, and a second metal layer on the first metal layer. The second metal layer may include second interconnection lines electrically connected to the first metal layer. The first barrier pattern may include single-crystalline silicon oxide, and the gate insulating layer may include amorphous silicon oxide.

DETAILED DESCRIPTION

Figure 1:
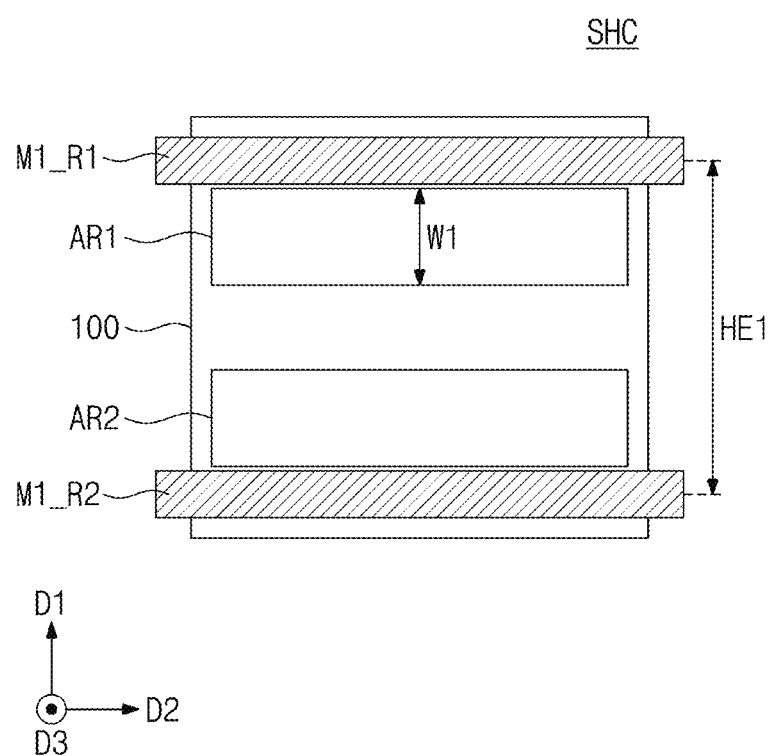
FIGS. 1 to 3 are conceptual diagrams illustrating logic cells of a semiconductor device according to an embodiment of the inventive concept.
Figure 2:
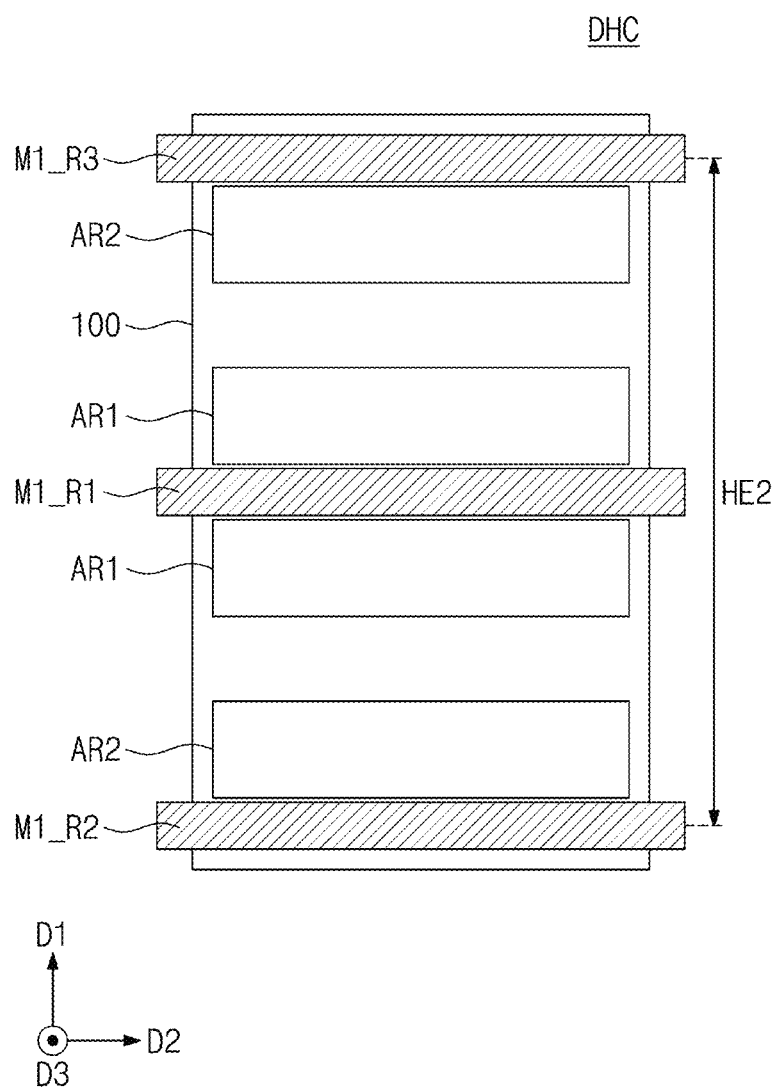
Figure 3:
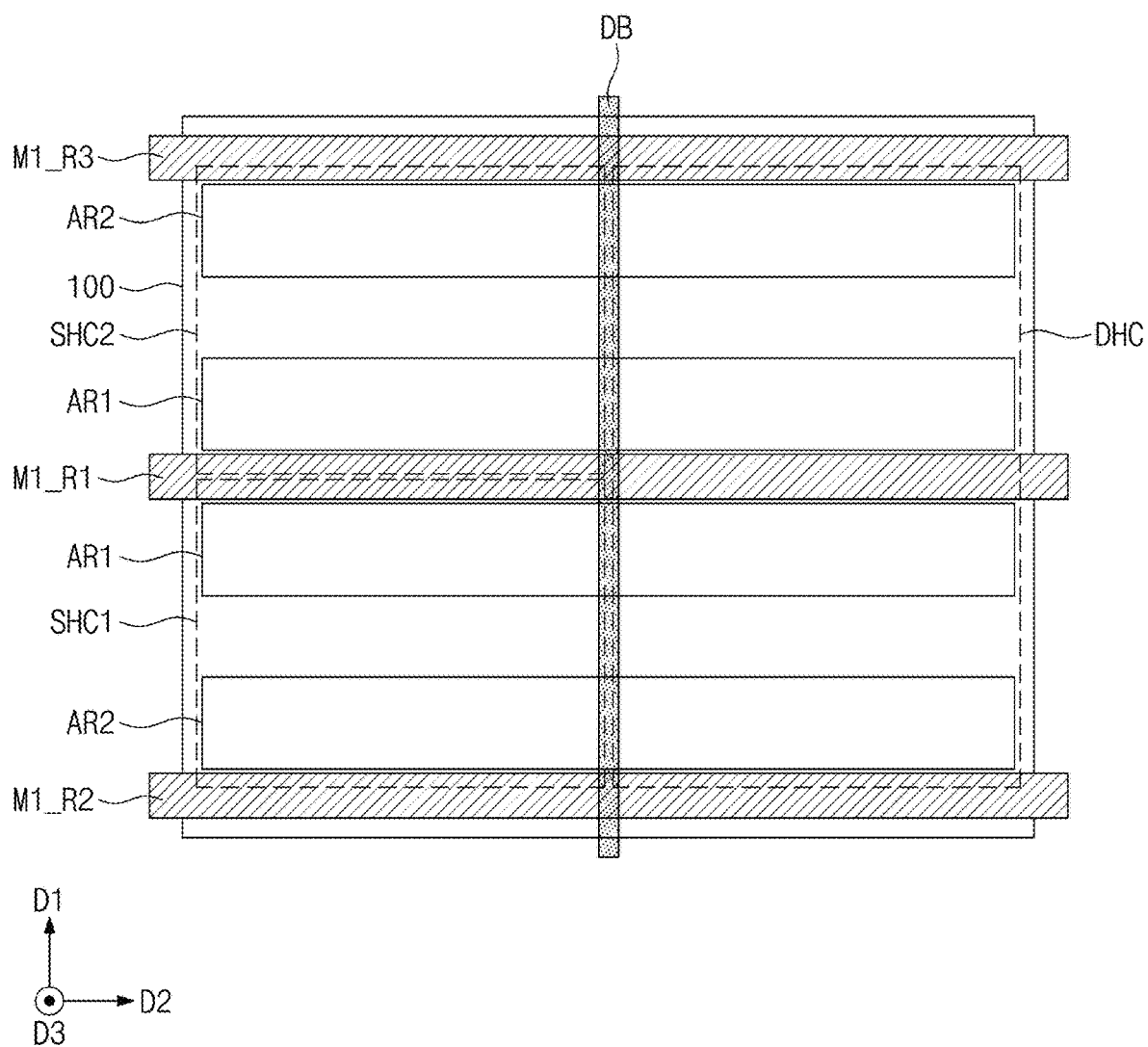

FIGS. 1 to 3 are conceptual diagrams illustrating logic cells of a semiconductor device according to an embodiment of the inventive concept.

Referring to FIG. 1, a single height cell SHC may be provided. In detail, a first power line M1_R1 and a second power line M1_R2 may be provided on a substrate 100 extending in a first direction D1 and a second direction D2, perpendicular to the first direction D1. The first power line M1_R1 may be a conduction path, to which a source voltage VSS (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other may be an NMOSFET region. For example, the single height cell SHC may have a CMOS structure provided between the first and second power lines M1_R1 and M1_R2.

Each of the first and second active regions AR1 and AR2 may have a first width W1 in the first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. For example, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AR1 and a pair of second active regions AR2.

One of the second active regions AR2 may be adjacent to the second power line M1_R2. The other of the second active regions AR2 may be adjacent to the third power line M1_R3. The pair of the first active regions AR1 may be adjacent to the first power line M1_R1. When viewed in a plan view, the first power line M1_R1 may be disposed between the pair of the first active regions AR1.

A length of the double height cell DHC in the first direction D1 may be defined as a second height HE2. The second height HE2 may be about two times the first height HE1 of FIG. 1. The pair of the first active regions AR1 of the double height cell DHC may be combined to serve as a single active region.

In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in the second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
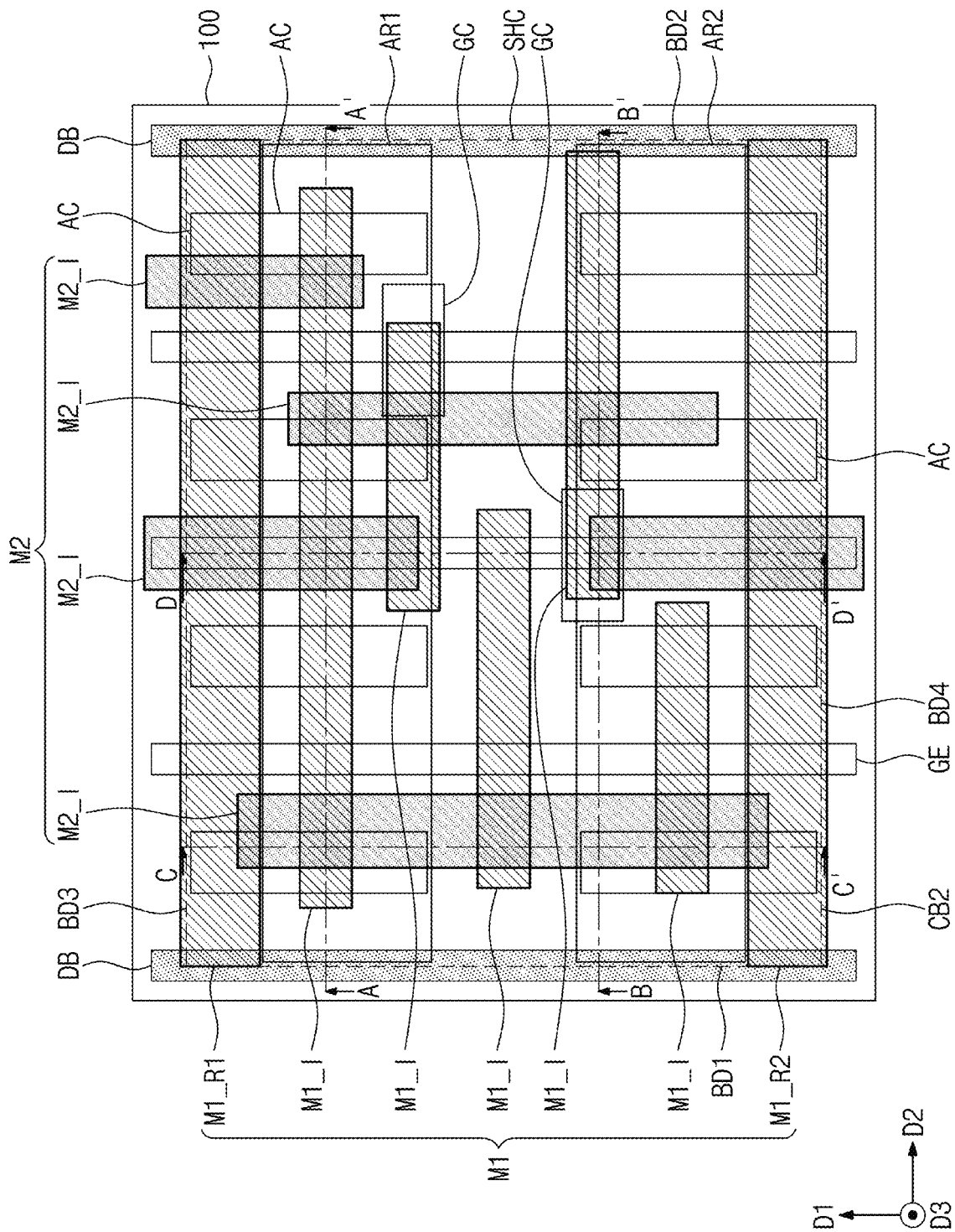
FIG. 4 is a plan view illustrating a semiconductor device according to an embodiment of the inventive concept.
Figure 5A:
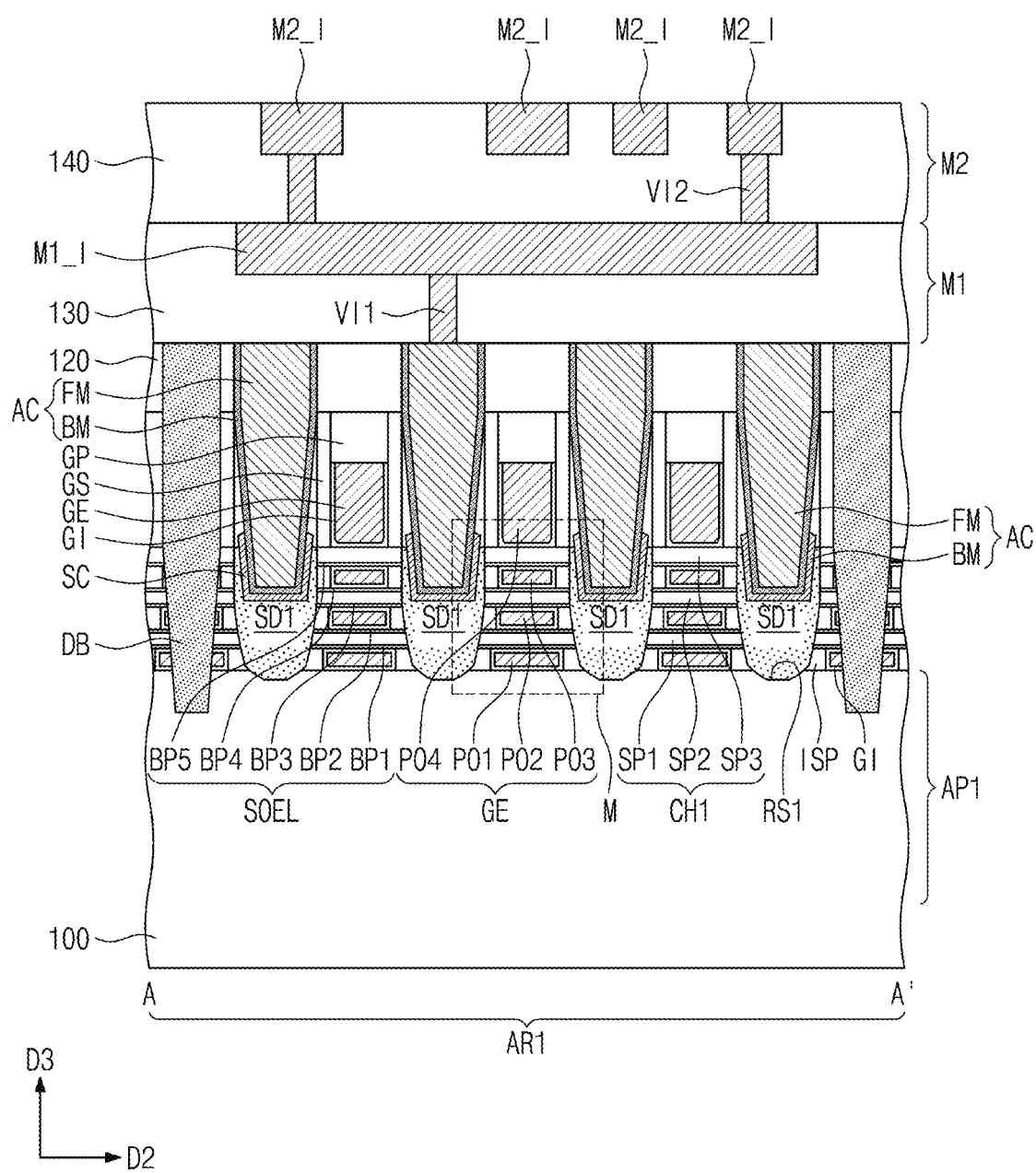
FIGS. 5A to 5D are sectional views taken along lines A-A', B-B', C-C', and D-D', respectively, of FIG. 4.
Figure 5B:
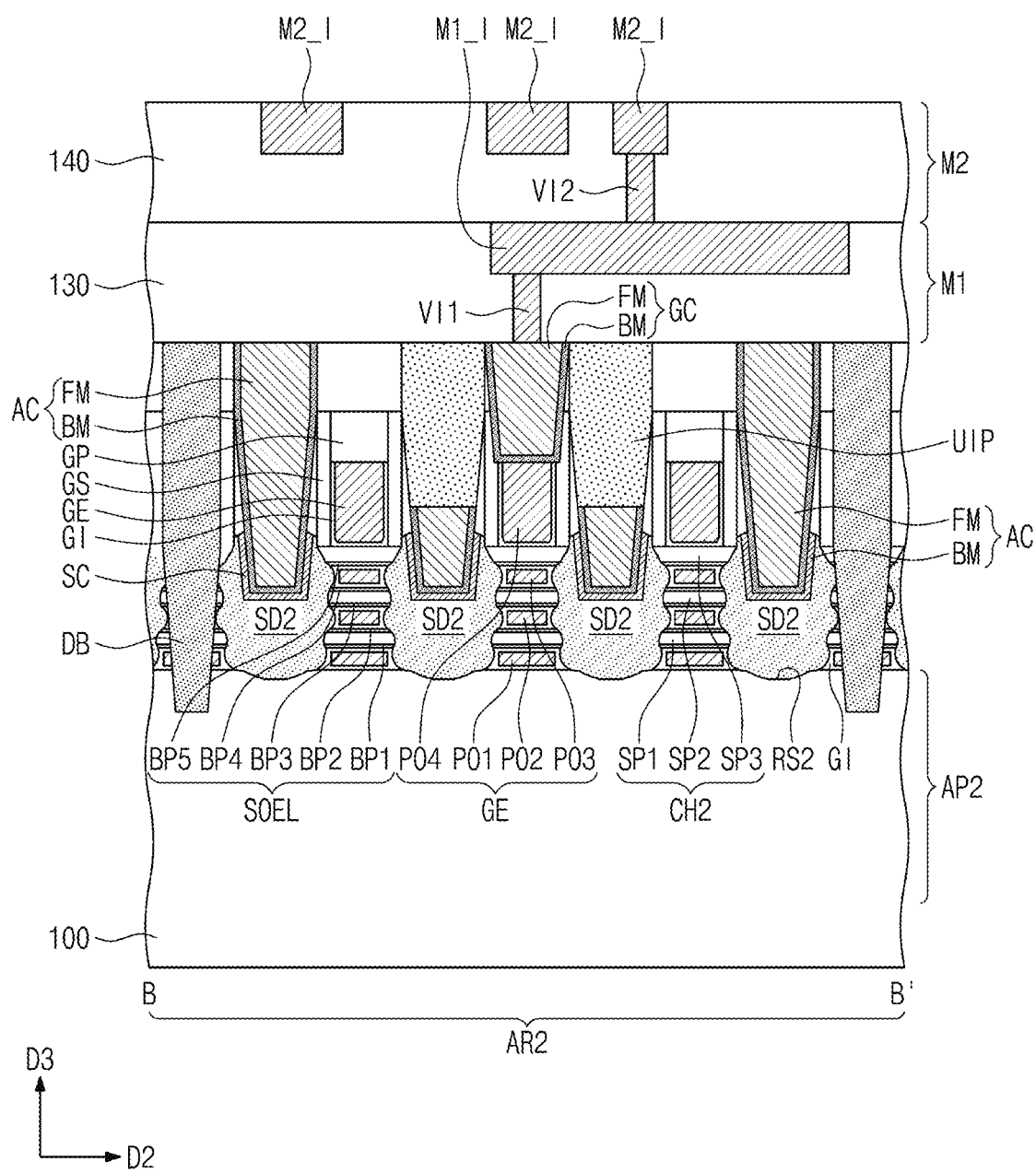
Figure 5C:
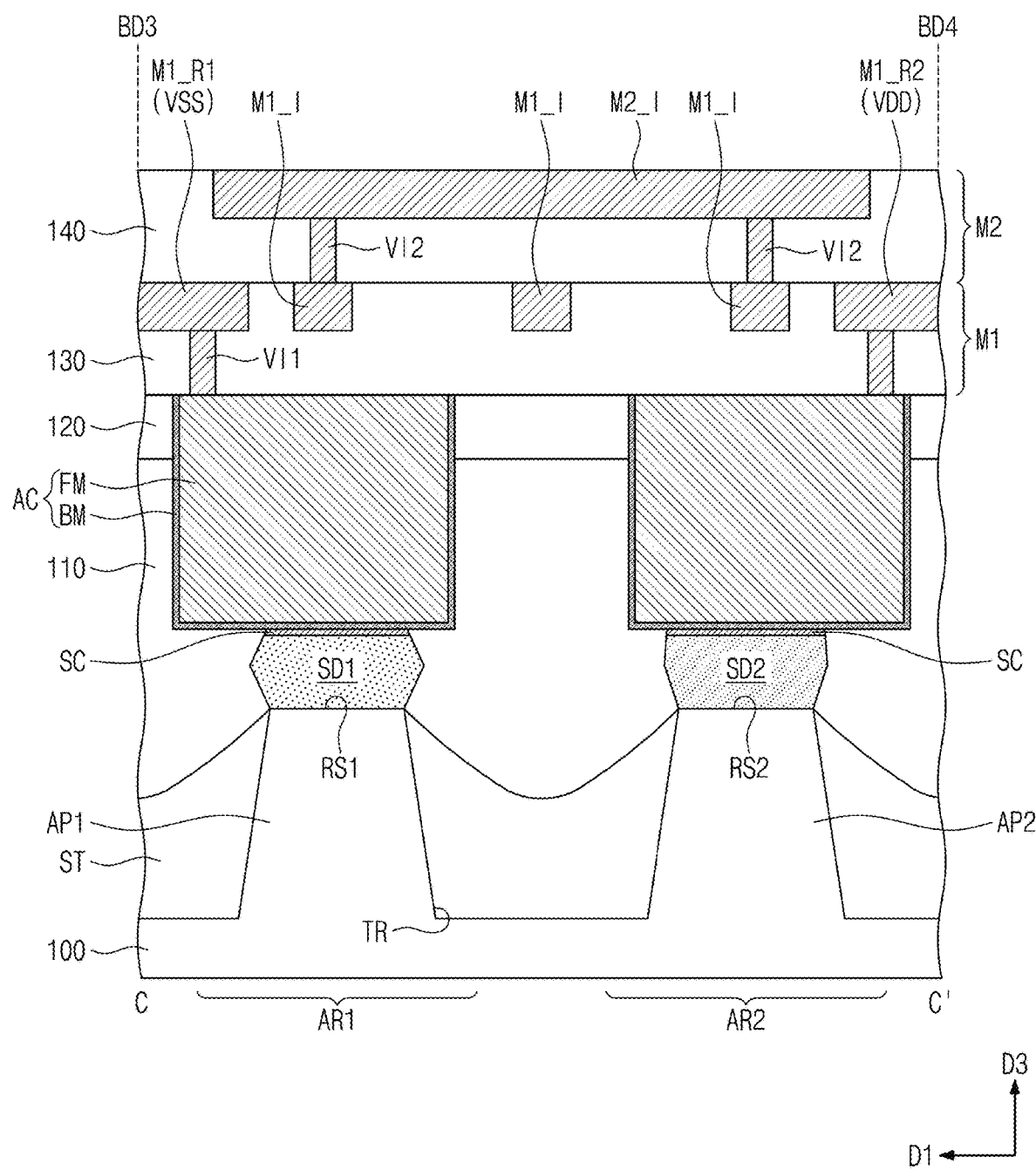

FIG. 4 is a plan view illustrating a semiconductor device according to an embodiment of the inventive concept. FIGS. 5A to 5D are sectional views taken along lines A-A', B-B', C-C', and D-D', respectively, of FIG. 4. FIG. 6A is an enlarged sectional view illustrating a portion 'M' of FIG. 5A. FIG. 6B is an enlarged sectional view illustrating a portion 'N' of FIG. 6A. The semiconductor device of FIGS. 4 and 5A to 5D may be an example of the single height cell SHC of FIG. 1.

Referring to FIGS. 4 and 5A to 5D, the single height cell SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first active region AR1 and the second active region AR2. Each of the first and second active regions AR1 and AR2 may be extended in the second direction D2. In an embodiment, the first active region AR1 may be an NMOSFET region, and the second active region AR2 may be a PMOSFET region.

A first active pattern AP1 and a second active pattern AP2 may be defined by a trench TR, which is formed in an upper portion of the substrate 100. The first active pattern AP1 may be provided on the first active region AR1, and the second active pattern AP2 may be provided on the second active region AR2. The first and second active patterns AP1 and AP2 may be extended in the second direction D2. Each of the first and second active patterns AP1 and AP2 may be a vertically-protruding portion of the substrate 100. For example, the first and second active patterns AP1 and AP2 may be a vertically protrude from the substrate 100 in a third direction D3, which is perpendicular to both the first direction D1 and the second direction D2.

A device isolation layer ST may be provided on the substrate 100. The device isolation layer ST may be provided to fill the trench TR. The device isolation layer ST may include a silicon oxide layer or a silicon oxynitride layer. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon (more specifically, single crystalline silicon). In an embodiment, the first to third semiconductor patterns SP1, SP2, and SP3 may be nanosheets that are stacked.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., n-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., p-type). The second channel pattern CH2 may be interposed between each pair of the second source/drain patterns SD2. For example, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In another embodiment, a top surface of at least one of the first and second source/drain patterns SD1 and SD2 may be located at substantially the same level as the top surface of the third semiconductor pattern SP3.

In an embodiment, the first source/drain patterns SD1 may be formed of or include the same semiconductor material (e.g., Si) as the substrate 100. The second source/drain patterns SD2 may include a semiconductor material (e.g., SiGe) whose lattice constant is greater than the semiconductor material (e.g., Si) of the substrate 100. In this case, the pair of the second source/drain patterns SD2 may exert a compressive stress on the second channel pattern CH2 therebetween.

In an embodiment, the second source/drain pattern SD2 may have an uneven or embossing side surface. For example, the side surface of the second source/drain pattern SD2 may have a wavy profile. The side surface of the second source/drain pattern SD2 may protrude toward first to third portions PO1, PO2, and PO3 of gate electrode GE to be described below.

Gate electrodes GE may be provided on the first and second channel patterns CH1 and CH2. Each of the gate electrodes GE may be extended in the first direction D1 to cross the first and second channel patterns CH1 and CH2. Each of the gate electrodes GE may be vertically overlapped with the first and second channel patterns CH1 and CH2. The gate electrodes GE may be arranged at a first pitch in the second direction D2.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Figure 5D:
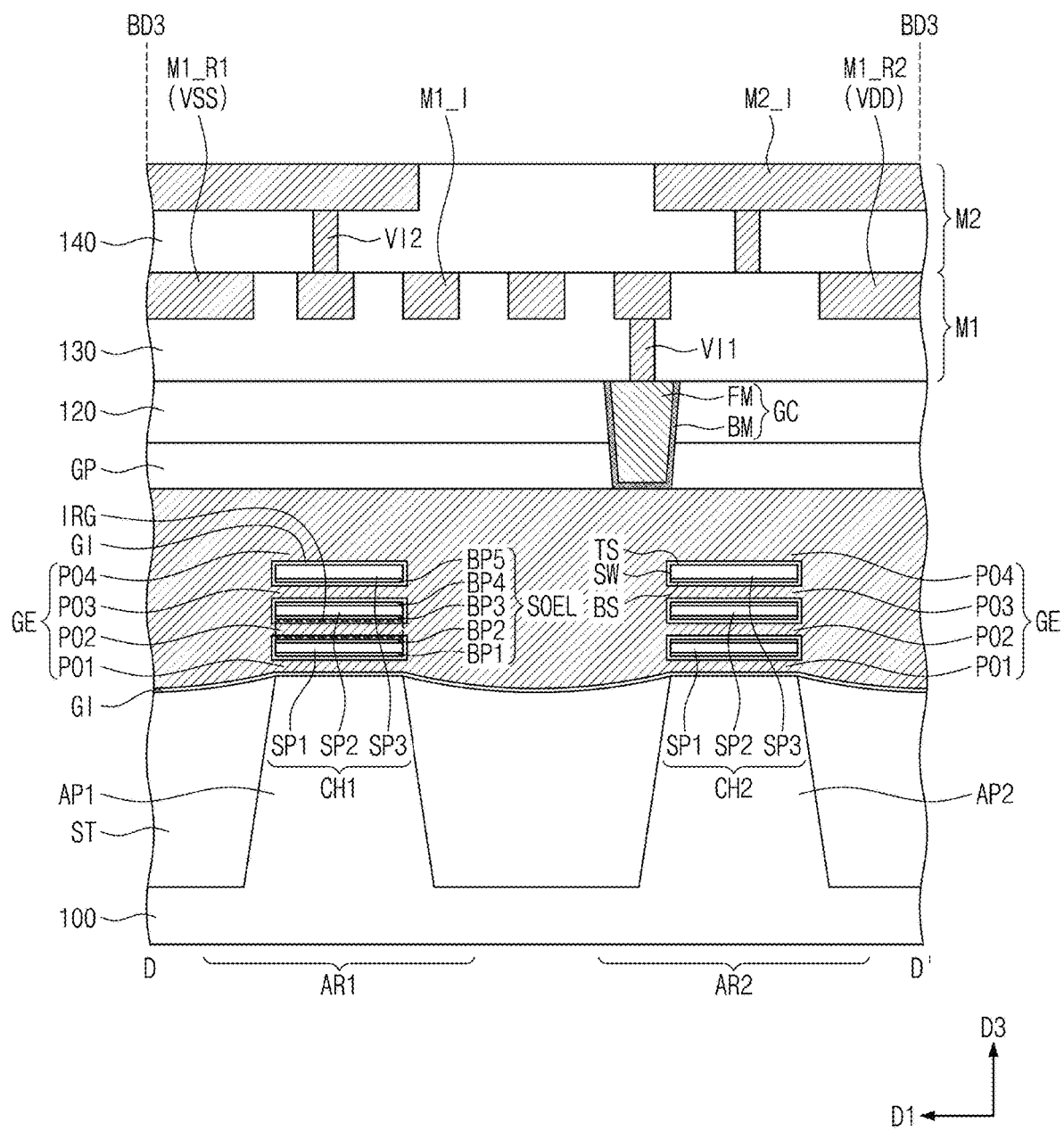
Figure 6A:
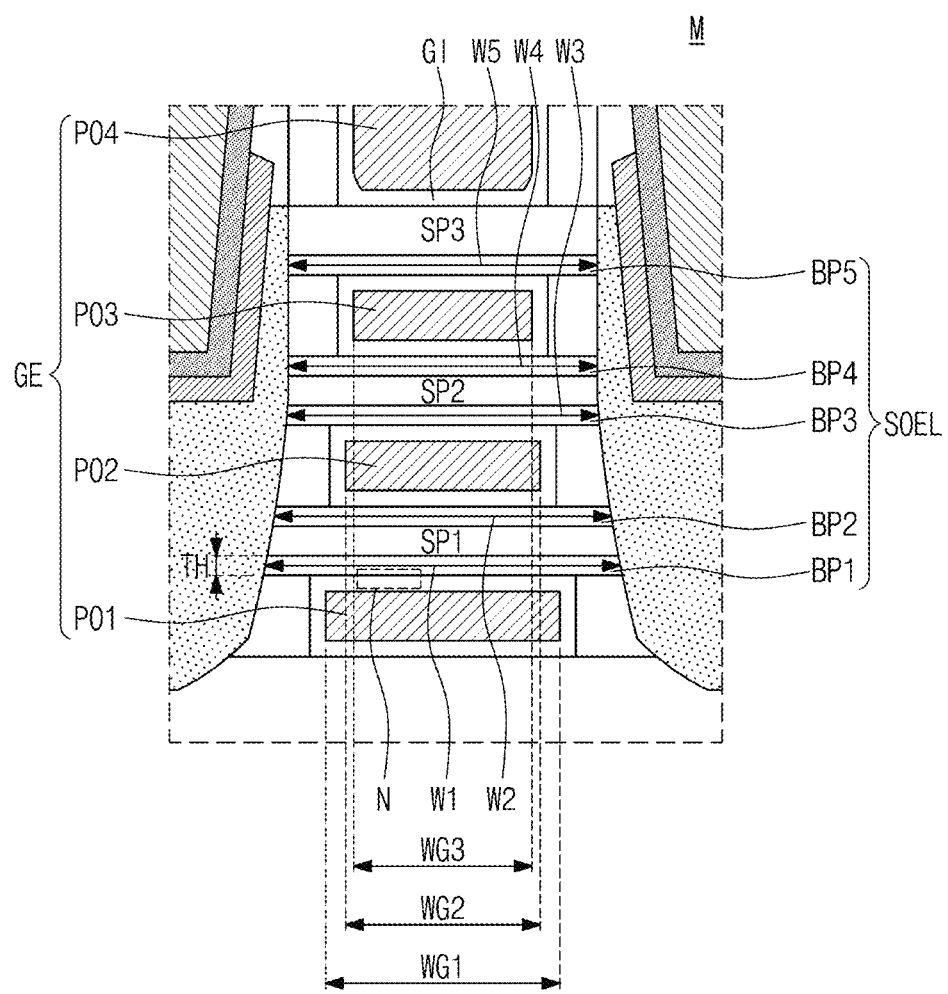
FIG. 6A is an enlarged sectional view illustrating a portion 'M' of FIG. 5A.
Figure 6B:
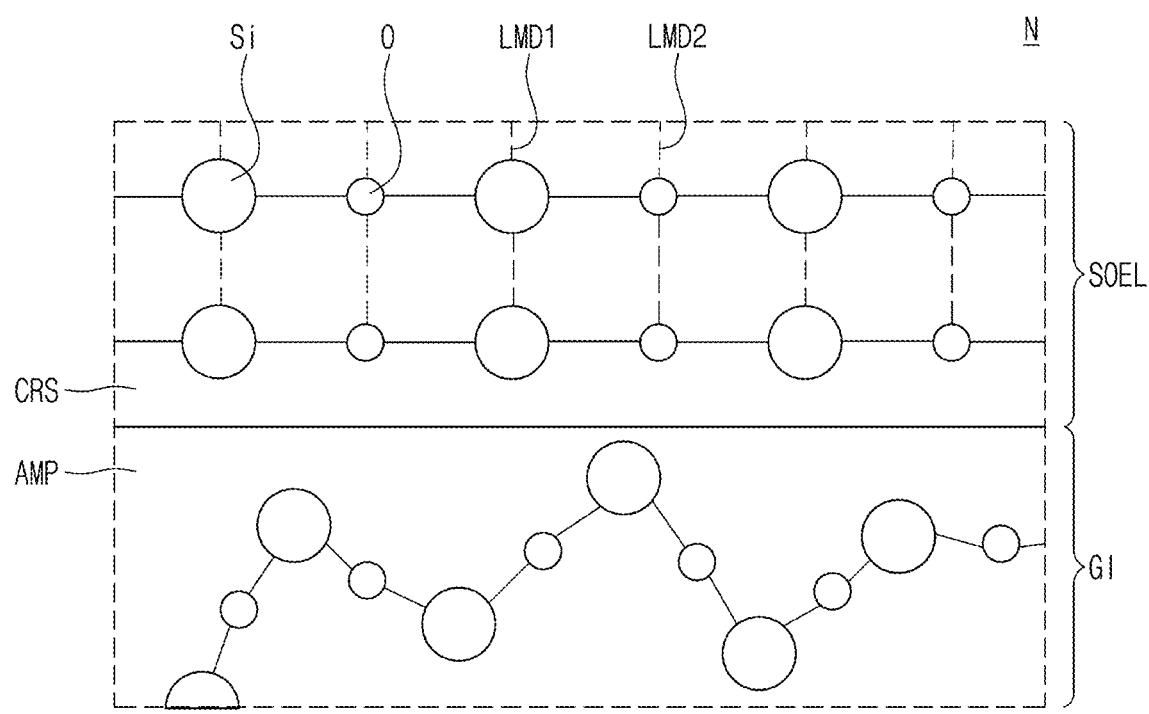
FIG. 6B is an enlarged sectional view illustrating a portion 'N' of FIG. 6A.

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

On the first active region AR1, inner spacers ISP may be respectively interposed between the first to third portions PO1, PO2, and PO3 of the gate electrode GE and the first source/drain pattern SD1. Each of the first to third portions PO1, PO2, and PO3 of the gate electrode GE may be spaced apart from the first source/drain pattern SD1 with the inner spacer ISP interposed therebetween. The inner spacer ISP may prevent a leakage current from the gate electrode GE.

Referring to FIGS. 5A, 5B, and 5D, barrier patterns SOEL may be respectively interposed between the first to third portions PO1 to PO3 of the gate electrode GE and the first to third semiconductor patterns SP1 to SP3 of the first and second channel patterns CH1 and CH2. The barrier patterns SOEL may include a first barrier pattern BP1, a second barrier pattern BP2, a third barrier pattern BP3, a fourth barrier pattern BP4, and a fifth barrier pattern BP5, which are sequentially stacked. The first to fifth barrier patterns BP1 to BP5 may be spaced apart from each other in a vertical direction (i.e., the third direction D3). The barrier patterns SOEL may prevent dopants or germanium atoms from being diffused into neighboring elements. The barrier patterns SOEL according to an embodiment of the inventive concept will be described in more detail with reference to FIGS. 6A and 6B.

Referring back to FIGS. 4 and 5A to 5D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or include at least one of SiCN, SiCON, or SiN. In another embodiment, the gate spacers GS may be a multi-layered structure, which is formed of or includes at least two different materials selected from SiCN, SiCON, and SiN. In an embodiment, the gate spacer GS may be formed of or include a Si-containing insulating material. The gate spacer GS may be used as an etch stop layer in a process of forming active contacts AC to be described below. Due to the gate spacer GS, the active contacts AC may be formed in a self-aligned manner Referring back to FIGS. 4 and 5A to 5D, a gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an embodiment, the gate insulating layer GI may include a silicon oxide layer, a silicon oxynitride layer, and/or a high-k dielectric layer. For example, the gate insulating layer GI may have a structure, in which a silicon oxide layer and a high-k dielectric layer are stacked. The high-k dielectric layer may be formed of or include at least one of high-k dielectric materials whose dielectric constants are higher than that of silicon oxide. As an example, the high-k dielectric layer may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may have a value selected from a range between 3 and 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may have a value selected from a range between 2 at % and 10 at %. In the case where the dopants are yttrium (Y), a content of yttrium in the ferroelectric layer may have a value selected from a range between 2 at % and 10 at %. In the case where the dopants are gadolinium (Gd), a content of gadolinium in the ferroelectric layer may have a value selected from a range between 1 at % and 7 at %. In the case where the dopants are zirconium (Zr), a content of zirconium in the ferroelectric layer may have a value selected from a range between 50 at % and 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness value selected from a range between 0.5 and 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

The single height cell SHC may have a first border BD1 and a second border BD2, which are opposite to each other in the second direction D2. The first and second borders BD1 and BD2 may be extended in the first direction D1. The single height cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be provided at both sides of the single height cell SHC. For example, the pair of the division structures DB may be respectively provided on the first and second borders BD1 and BD2 of the single height cell SHC. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the single height cell SHC from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Gate contacts GC may be provided to penetrate the second interlayer insulating layer 120 and the gate capping pattern GP and to be electrically connected to the gate electrodes GE, respectively. When viewed in a plan view, the gate contacts GC may be disposed to be respectively overlapped with the first and second active regions AR1 and AR2. As an example, the gate contact GC may be provided on the second active pattern AP2 (e.g., see FIG. 5B).

In an embodiment, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. For example, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, and first interconnection lines M1_I. Each of the interconnection lines M1_R1, M1_R2, and M1_I of the first metal layer M1 may be extended in the second direction D2 and parallel to each other.

In detail, the first and second power lines M1_R1 and M1_R2 may be respectively provided on the third and fourth borders BD3 and BD4 of the single height cell SHC. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected to each other through the first via VD. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VD of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. For example, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

The barrier patterns SOEL will be described in more detail with reference to FIG. 6A. The barrier patterns SOEL may include the first to fifth barrier patterns BP1 to BP5, which are sequentially stacked. The first to fifth barrier patterns BP1 to BP5 may be spaced apart from each other in a vertical direction (e.g., the third direction D3).

More specifically, the first barrier pattern BP1 may be provided to be adjacent to a bottom surface of the first semiconductor pattern SP1. The second barrier pattern BP2 may be provided to be adjacent to a top surface of the first semiconductor pattern SP1. For example, the first semiconductor pattern SP1 may be interposed between the first and second barrier patterns BP1 and BP2. The third barrier pattern BP3 may be provided to be adjacent to a bottom surface of the second semiconductor pattern SP2. The fourth barrier pattern BP4 may be provided to be adjacent to a top surface of the second semiconductor pattern SP2. For example, the second semiconductor pattern SP2 may be interposed between the third and fourth barrier patterns BP3 and BP4. The fifth barrier pattern BP5 may be provided to be adjacent to a bottom surface of the third semiconductor pattern SP3.

For example, the first barrier pattern BP1 may be interposed between the gate insulating layer GI, which covers the first portion PO1 of the gate electrode GE, and the first semiconductor pattern SP1. The second barrier pattern BP2 may be interposed between the first semiconductor pattern SP1 and the gate insulating layer GI covering the second portion PO2. The third barrier pattern BP3 may be interposed between the gate insulating layer GI, which covers the second portion PO2, and the second semiconductor pattern SP2. The fourth barrier pattern BP4 may be interposed between the second semiconductor pattern SP2 and the gate insulating layer GI covering the third portion PO3. The fifth barrier pattern BP5 may be interposed between the gate insulating layer GI, which covers the third portion PO3, and the third semiconductor pattern SP3. A barrier pattern may not be formed between the third semiconductor pattern SP3 and the fourth portion PO4 of the gate electrode GE.

Each of the first to fifth barrier patterns BP1 to BP5 may have a width W1-W5 in in the second direction D2 (see FIG. 5A). Each of the first to fifth barrier patterns BP1 to BP5 may be in contact with the first source/drain patterns SD1. Each of the first to fifth barrier patterns BP1 to BP5 may be adjacent to the first source/drain patterns SD1. The first source/drain patterns SD1 may be formed such that widths in the second direction D2 of FIG. decrease in a downward direction (e.g., the third direction D3). Thus, the first to fifth barrier patterns BP1 to BP5 may have first to fifths widths W1 to W5 that are different from each other. For example, the widths W1 to W5 of the first to fifth barrier patterns BP1 to BP5 may increase in a downward direction (e.g., the third direction D3). The fourth width W4 may be larger than the fifth width W5, and the third width W3 may be larger than the fourth width W4. The second width W2 may be larger than the third width W3, and the first width W1 may be larger than the second width W2. Among the widths W1-W5 of the barrier patterns BP1-BP5, the first width W1 of the first barrier pattern BP1 may have the largest value.

Each of the first to fifth barrier patterns BP1 to BP5 may cover the gate insulating layer GI and the inner spacer ISP. For example, each of the first to fifth widths W1 to W5 may be larger than each of widths WG1-WG3 of the first to third portions PO1 to PO3 of the gate electrode GE.

The barrier patterns SOEL may be an epitaxial layer including at least a portion that is formed of single-crystalline silicon oxide. For example, the barrier patterns SOEL may be formed of or include crystalline silicon oxide. The barrier patterns SOEL may be formed by an epitaxy process. For example, the barrier patterns SOEL may be formed by one of liquid-phase epitaxy (LPE), vapor-phase epitaxy (VPE), molecular beam epitaxy (MBE), or metal organic chemical vapor deposition (MOCVD) processes. More specifically, the VPE process may include hydride vapor phase epitaxy (HYPE), chloride vapor phase epitaxy (CVPE), or metal organic vapor phase epitaxy (MOVPE) processes.

Each of the barrier patterns SOEL may have a thickness value TH selected from a range between 30 Å and 40 Å. Each of the barrier patterns SOEL may be or include a single atom-level film that is formed of uniformly-arranged atoms. In an embodiment, each of the barrier patterns SOEL may be a pattern or structure, which is composed of the stacked single atom-level films. The barrier patterns SOEL may have the same crystal direction as the crystal direction of a seed layer. That is, each of the atoms constituting the barrier patterns SOEL may be arranged and stacked according to the crystal direction of the seed layer. For example, the thickness TH of each of the barrier patterns SOEL may be a total thickness of the stacked single atom-level films.

Referring to FIGS. 6A and 6B, the barrier patterns SOEL and the gate insulating layer GI may be formed of or include silicon oxide. The silicon oxide of the barrier patterns SOEL may have a different crystal structure from the silicon oxide of the gate insulating layer GI. For example, the barrier patterns SOEL may be formed of or include crystalline silicon oxide, and the gate insulating layer GI may be formed of or include amorphous silicon oxide.

More specifically, in each of the barrier patterns SOEL, silicon atoms (Si) and oxygen atoms (O) may be alternately arranged to form a lattice structure. For example, the barrier patterns SOEL may have a regular lattice structure. The first lattice direction LMD1 in FIG. 6B may be a stacking direction of the silicon atoms (Si). The second lattice direction LMD2 in FIG. 6B may be a stacking direction of the oxygen atoms (O). The first and second lattice directions LMD1 and LMD2 may vary depending on a lattice direction of a seed layer. In an embodiment, each of the barrier patterns SOEL may include a region CRS made of crystalline silicon oxide. The barrier patterns SOEL may include single-crystalline silicon oxide. An oxygen concentration of each of the barrier patterns SOEL may have a value selected from a range between 7.0E18 atoms/cm$^3$ and 1.3E19 atoms/cm$^3$.

In the gate insulating layer GI, positions of silicon atoms (Si) and oxygen atoms (O) may depend on a bonding structure therebetween. The gate insulating layer GI may have an irregular lattice structure. For example, the gate insulating layer GI may include a region AMP made of amorphous silicon oxide. An oxygen concentration of the gate insulating layer GI may be higher than the oxygen concentration of the barrier patterns SOEL.

In an embodiment, the barrier patterns SOEL may include a plurality of stacks. The stacks are single crystal unit structures in which silicon atoms and oxygen atoms are bonded in the horizontal direction. Silicon atoms and oxygen atoms of the stacks are alternatively arranged to form a lattice structure. For example, each of the stacks is a unit structure in which one silicon atom and one oxygen atom are combined. Each of the barrier patterns SOEL may include a plurality of the stacks and a space where an element coupling between the plurality of the stacks is broken. The stacks are horizontally disposed to be spaced apart from each other. The stacks may be spaced apart from each other in the second direction (e.g., D2 of FIG. 5A). In each of the stacks, silicon atoms and oxygen atoms may be alternately arranged to form a lattice structure. A thickness of each of the stacks may be equal to the thickness TH of the barrier pattern SOEL (e.g., see FIG. 6A).

FIGS. 7A to 12C are sectional views illustrating a method of fabricating a semiconductor device, according to an embodiment of the inventive concept. In detail, FIGS. 7A, 8A, 9A, 10A, 11A, and 12A are sectional views taken along a line A-A' of FIG. 4. FIGS. 9B and 10B are sectional views taken along a line B-B' of FIG. 4. FIGS. 9C, 10C, 11B, and 12B are sectional views taken along a line C-C' of FIG. 4. FIGS. 7B, 8B, 11C, and 12C are sectional views taken along a line D-D' of FIG. 4.

Figure 7A:
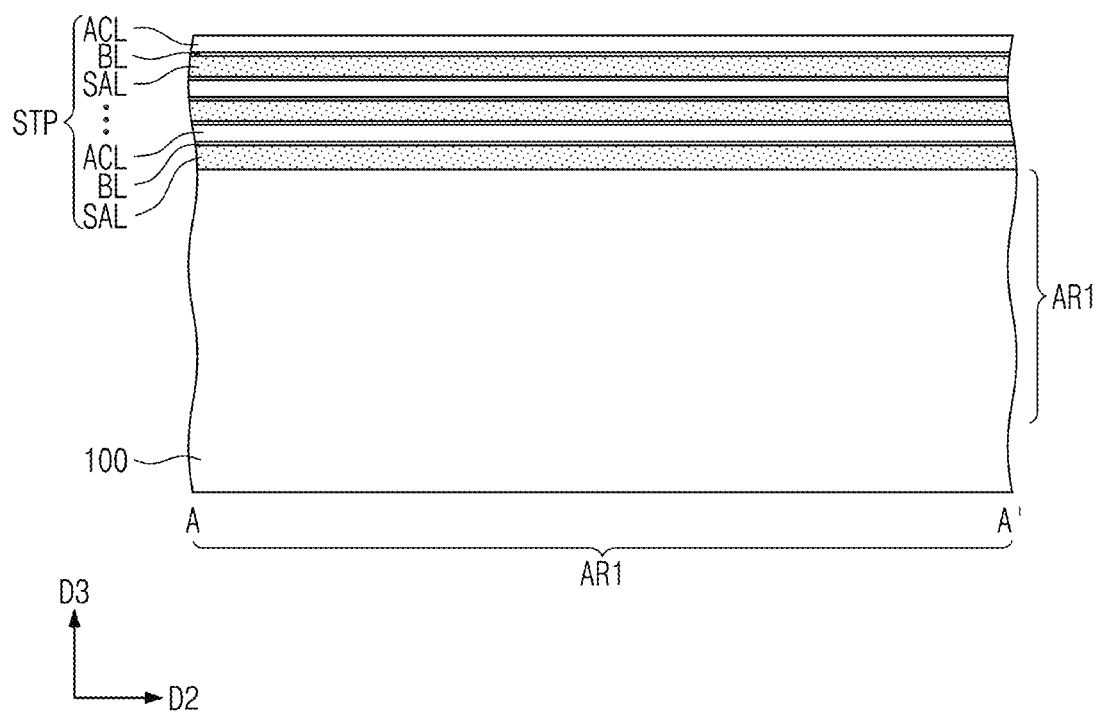
FIGS. 7A, 7B, 8A, 8B, 9A to 9C, 10A to 10C, 11A to 11C and 12A to 12C are sectional views illustrating a method of fabricating a semiconductor device, according to an embodiment of the inventive concept.
Figure 7B:
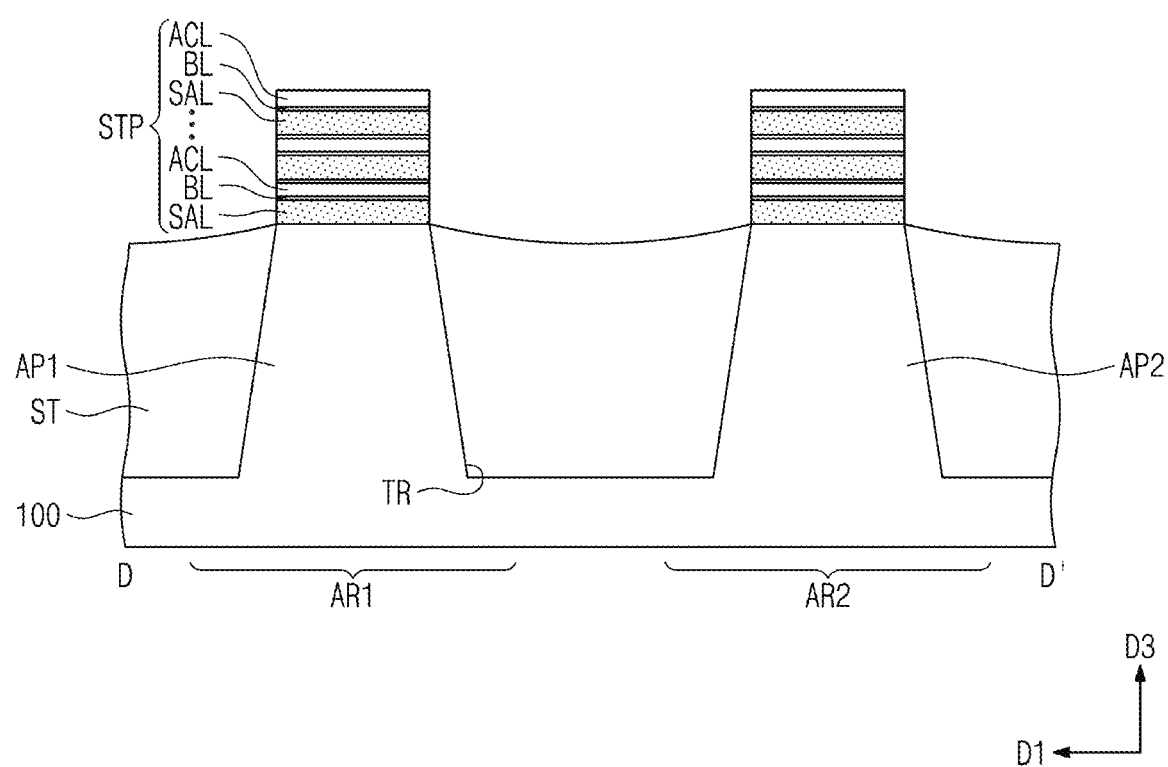

Referring to FIGS. 7A and 7B, the substrate 100 including the first and second active regions AR1 and AR2 may be provided. Sacrificial layers SAL, barrier layers BL and active layers ACL may be formed to be sequentially stacked on the substrate 100. In detail, the barrier layer BL may be formed on the sacrificial layer SAL, and the active layer ACL may be formed on the barrier layer BL. The other barrier layer may be formed on the active layer ACL. In other words, the active layer ACL may be interposed between the barrier layer BL and the other barrier layer. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe). The barrier layers BL may include silicon (Si) and oxygen (O). In an embodiment, the barrier layers BL may be formed by an epitaxy process.

The barrier layers BL may be formed by one of liquid-phase epitaxy (LPE), vapor-phase epitaxy (VPE), molecular beam epitaxy (MBE), or metal organic chemical vapor deposition (MOCVD) processes. More specifically, the VPE process may include hydride vapor phase epitaxy (HYPE), chloride vapor phase epitaxy (CVPE), or metal organic vapor phase epitaxy (MOVPE) processes.

The sacrificial layers SAL and the active layers ACL may be used as a seed layer in a process of forming the barrier layers BL. In this case, a lattice structure of the barrier layers BL may be the same as the sacrificial layers SAL and the active layers ACL. In addition, lattice directions (e.g., LMD1 and LMD2 of FIG. 6B) of silicon and oxygen atoms in the barrier layers BL may be substantially the same as those in the sacrificial layers SAL and the active layers ACL.

The barrier layers BL may prevent undesired diffusion of dopants or germanium atoms (Ge) in the sacrificial layers SAL in a subsequent thermal process. Here, the dopants may be boron (B) or phosphorus (P).

The sacrificial layer SAL may be formed of or include at least one of materials having an etch selectivity with respect to the active layer ACL. For example, the active layers ACL may include silicon (Si), and the sacrificial layers SAL may be formed of or include silicon-germanium (SiGe). A germanium concentration of each of the sacrificial layers SAL may have a value selected from a range between 10 at % and 30 at %. In addition, due to the presence of the barrier layers BL, a subsequent replacement metal gate (RMG) process may be performed with an improved etch selectivity. In this case, it may be possible to reduce a process time for removing the sacrificial layer SAL and thereby to improve process efficiency in the fabrication process.

Mask patterns may be respectively formed on the first and second active regions AR1 and AR2 of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on the first active region AR1. The second active pattern AP2 may be formed on the second active region AR2.

A stacking pattern STP may be formed on each of the first and second active patterns AP1 and AP2. The stacking pattern STP may include the sacrificial layers SAL, the barrier layers BL, and the active layers ACL, which are sequentially stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. For example, the stacking patterns STP may protrude vertically above the device isolation layer ST.

Figure 8A:
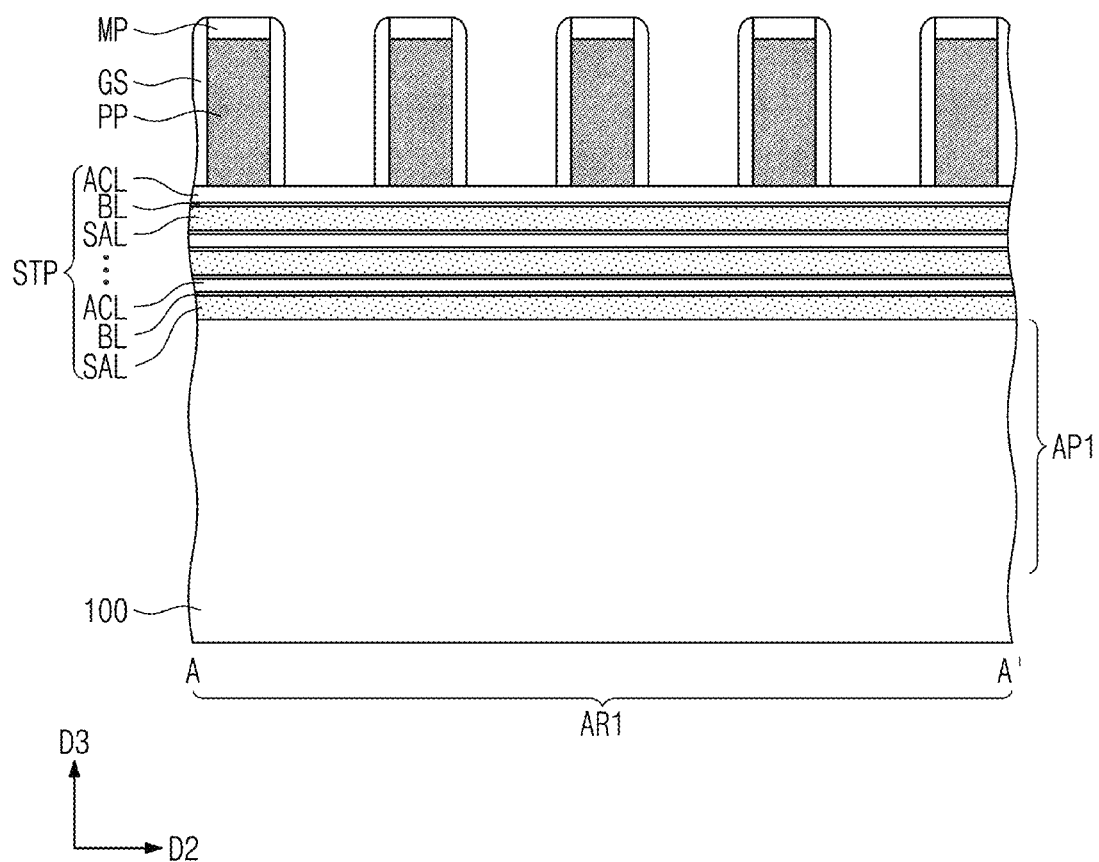
Figure 8B:
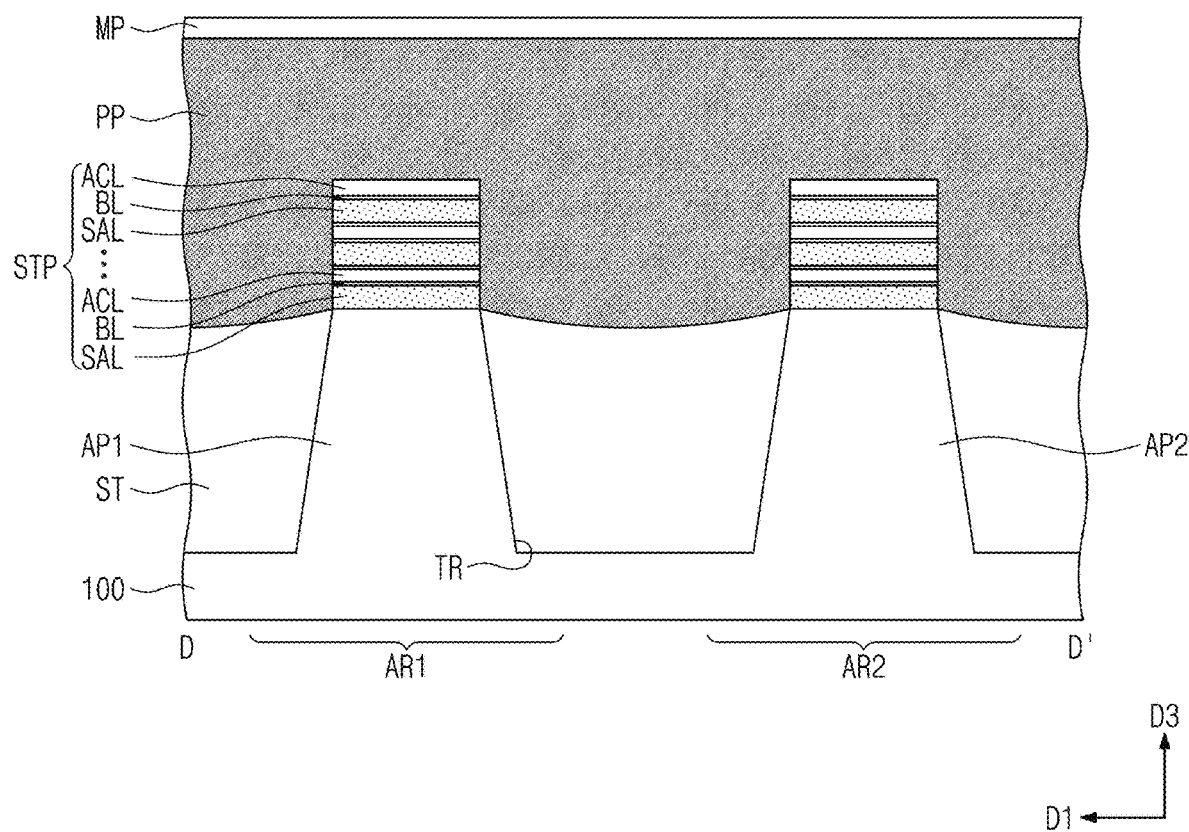

Referring to FIGS. 8A and 8B, sacrificial patterns PP may be formed on the substrate 100 to cross the stacking patterns STP. Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer GS may be a multi-layered structure including at least two layers.

Figure 9A:
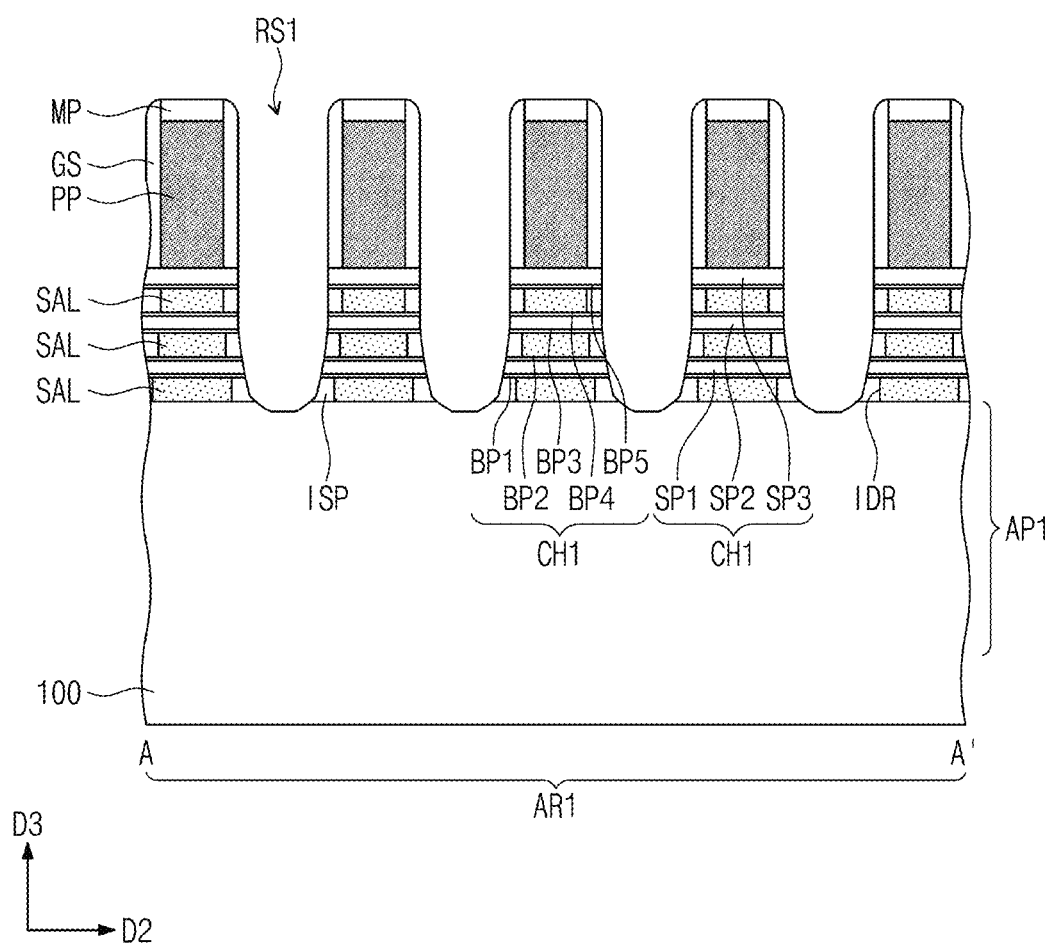
Figure 9B:
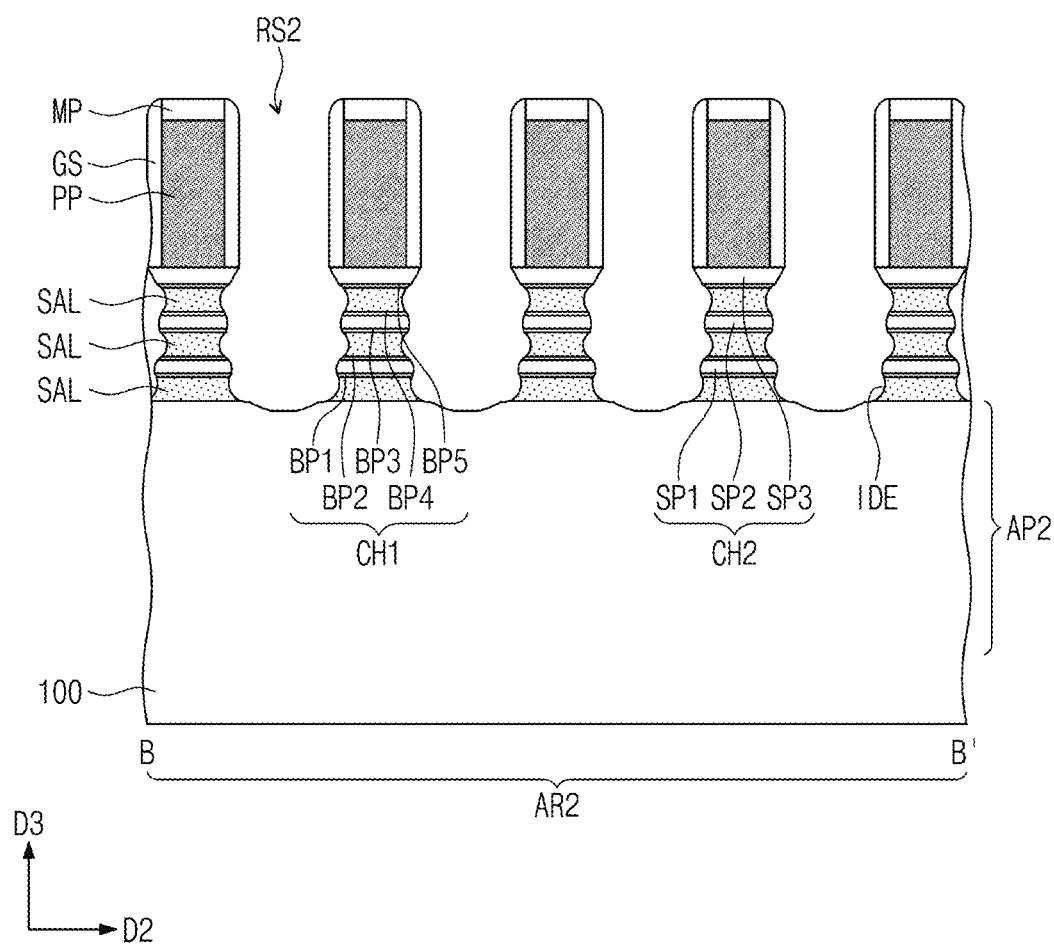
Figure 9C:
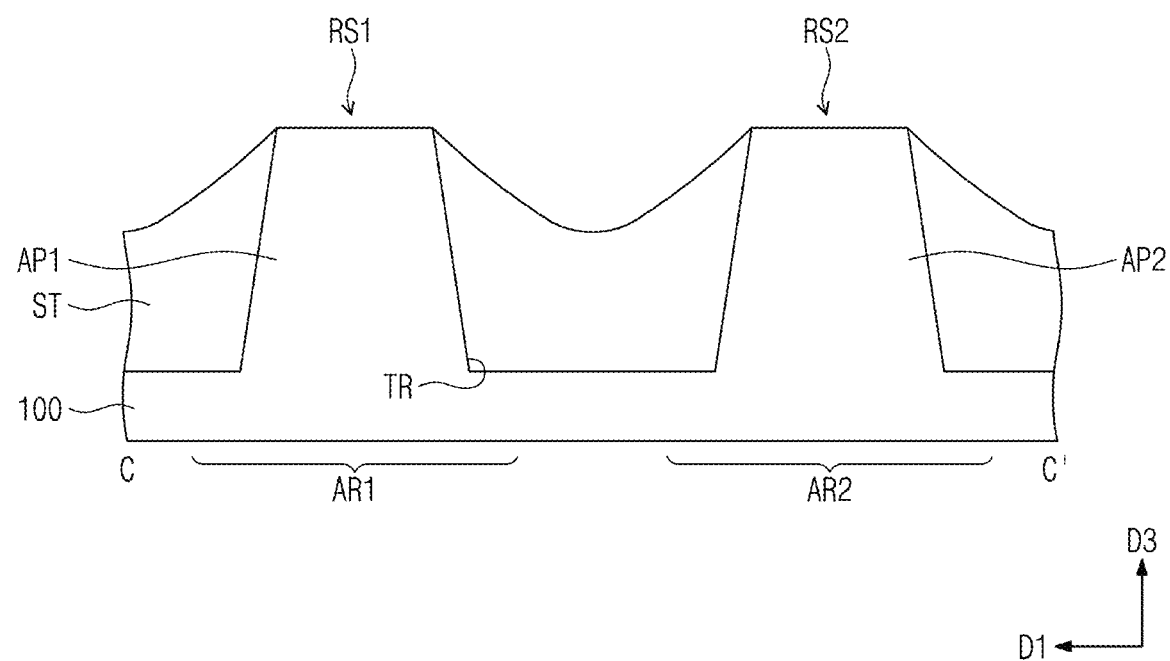

Referring to FIGS. 9A to 9C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 9C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3 between adjacent ones of the first recesses RS1 may constitute the first channel pattern CH1.

The first to fifth barrier patterns BP1, BP2, BP3, BP4, and BP5, which are sequentially stacked between adjacent ones of the first recesses RS1, may be respectively formed from the barrier layers BL. The first to fifth barrier patterns BP1, BP2, BP3, BP4, and BP5 between the adjacent ones of the first recesses RS1 may constitute the barrier patterns SOEL that is formed of an epitaxial layer.

The first recess RS1 may be formed between adjacent ones of the sacrificial patterns PP. A width of the first recess RS1 in the second direction D2 may decrease as a distance to the substrate 100 decreases.

The sacrificial layers SAL may be exposed through the first recess RS1. A selective etching process may be performed on the exposed sacrificial layers SAL. The etching process may include a wet etching process of removing only silicon-germanium selectively. As a result of the etching process, each of the sacrificial layers SAL may be indented to form an indent region IDR. Due to the presence of the indent region IDR, the sacrificial layer SAL may have a concave side surface. An insulating layer may be formed in the first recess RS1 to fill the indent regions IDR. The first to third semiconductor patterns SP1, SP2, and SP3 and the sacrificial layers SAL, which are exposed by the first recess RS1, may be used as a seed layer for the insulating layer. The insulating layer may be grown as a crystalline dielectric layer, owing to the crystalline structure of the semiconductor materials of the first to third semiconductor patterns SP1, SP2, and SP3 and the sacrificial layers SAL.

The inner spacer ISP may be formed to fill the indent region IDR. In detail, the formation of the inner spacer ISP may include performing a wet etching process on the epitaxial dielectric layer until the side surfaces of the first to third semiconductor patterns SP1, SP2, and SP3 are exposed. Accordingly, the epitaxial dielectric layer may form the inner spacer ISP that is left in only the indent region IDR.

Referring back to FIGS. 9A to 9C, the second recesses RS2 in the stacking pattern STP on the second active pattern AP2 may be formed by a method that is similar to that for the first recesses RS1. A selective etching process may be performed on the sacrificial layers SAL, which are exposed by the second recess RS2, to form indent regions IDE on the second active pattern AP2. Due to the indent regions IDE, the second recess RS2 may have a wavy inner side surface. The inner spacers ISP may not be formed in the indent regions IDE on the second active pattern AP2. The first to third semiconductor patterns SP1, SP2, and SP3 between adjacent ones of the second recesses RS2 may constitute the second channel pattern CH2. The first to fifth barrier patterns BP1, BP2, BP3, BP4, and BP5, which are sequentially stacked between adjacent ones of the second recesses RS2, may be respectively formed from the barrier layers BL. The first to fifth barrier patterns BP1, BP2, BP3, BP4, and BP5 between the adjacent ones of the second recesses RS2 may constitute the barrier patterns SOEL that is formed of an epitaxial layer.

Figure 10A:
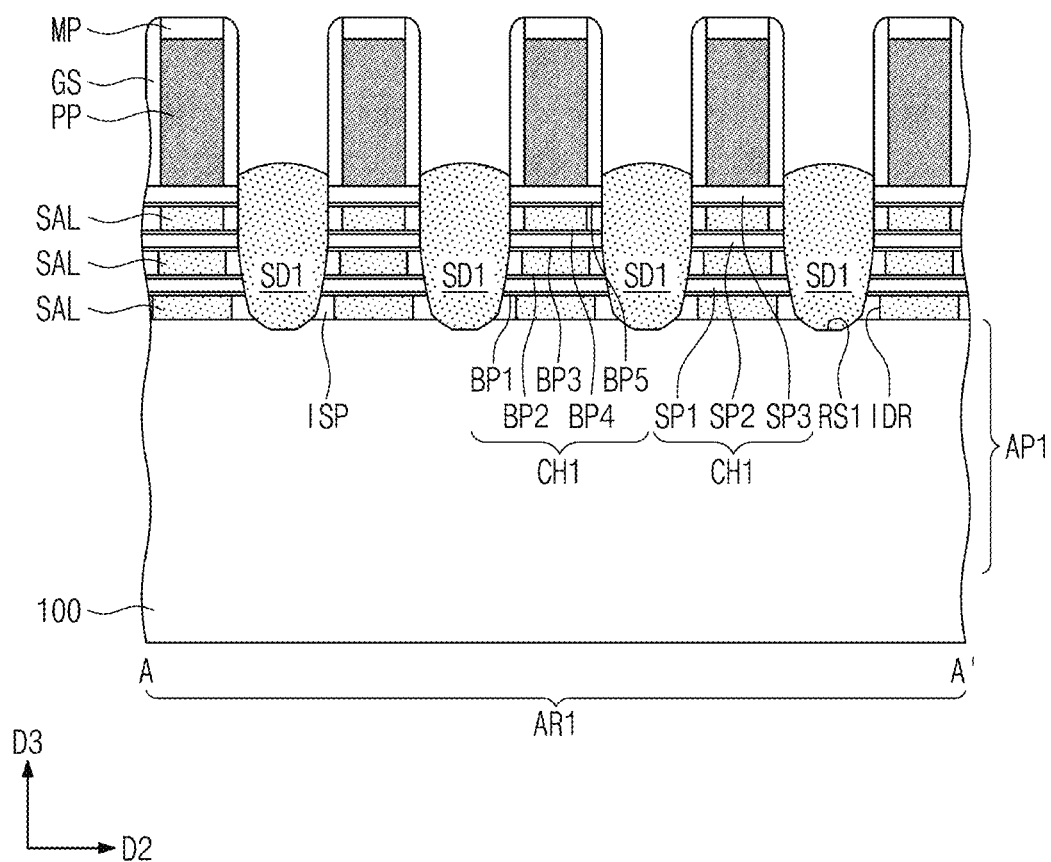
Figure 10B:
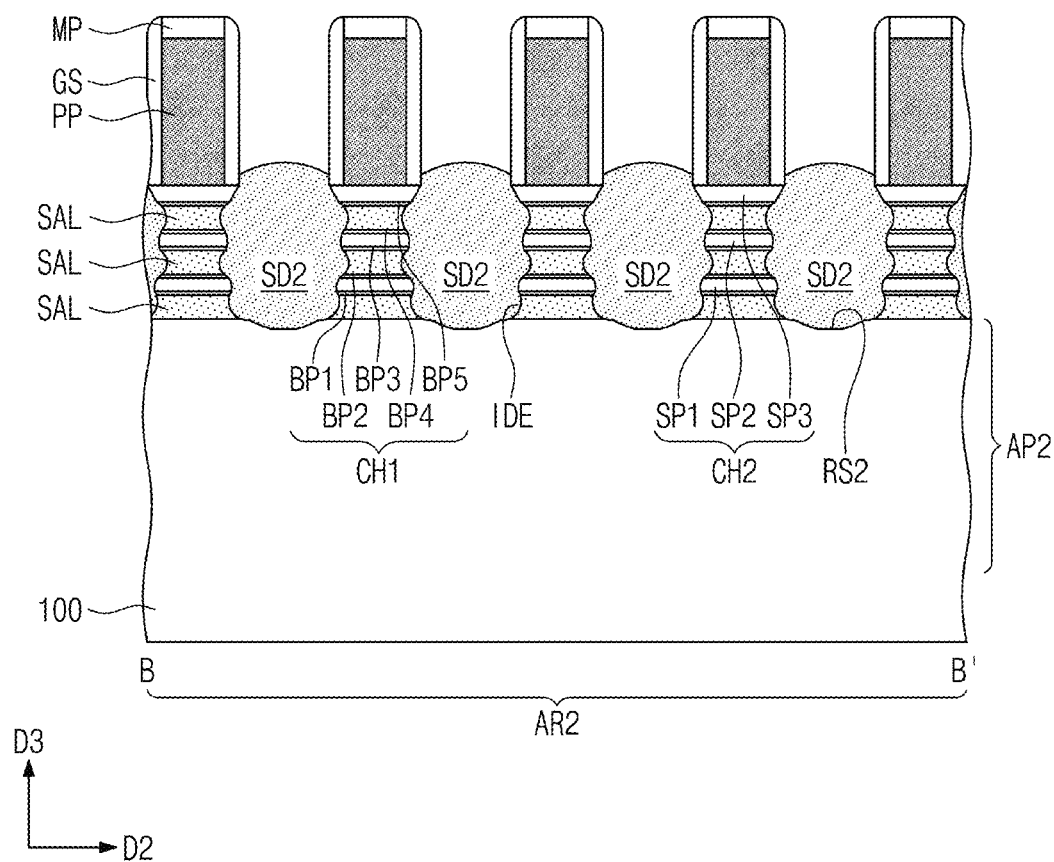
Figure 10C:
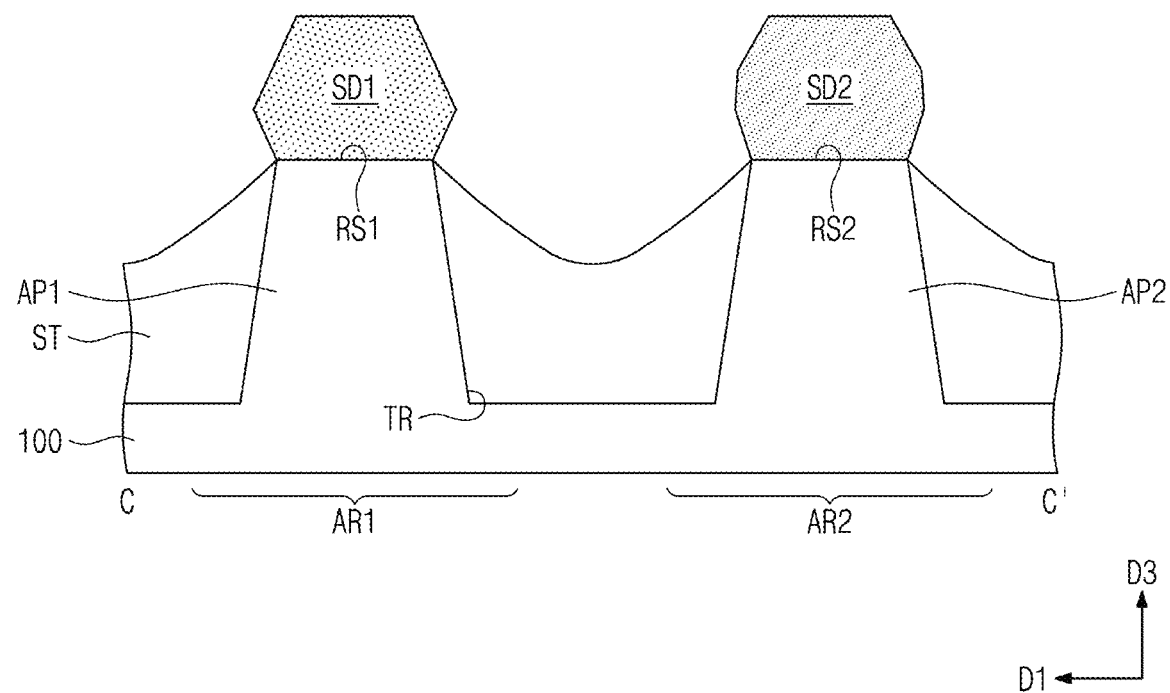

Referring to FIGS. 10A to 10C, the first source/drain patterns SD1 may be formed in the first recesses RS1, respectively. In detail, a SEG process, in which an inner surface of the first recess RS1 is used as a seed layer, may be performed to form an epitaxial layer filling the first recess RS1. The epitaxial layer may be grown using the first to third semiconductor patterns SP1, SP2, and SP3 and the substrate 100, which are exposed by the first recess RS1, as the seed layer. In an embodiment, the SEG process may include a chemical vapor deposition (CVD) process or a molecular beam epitaxy (MBE) process.

In an embodiment, the first source/drain pattern SD1 may be formed of or include the same semiconductor element (e.g., Si) as the substrate 100. During the formation of the first source/drain pattern SD1, the first source/drain pattern SD1 may be doped in-situ with n-type impurities (e.g., phosphorus, arsenic, or antimony). Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a SEG process using an inner surface of the second recess RS2 as a seed layer.

In an embodiment, the second source/drain pattern SD2 may be formed of or include a semiconductor material (e.g., SiGe) whose lattice constant is greater than that of a semiconductor material of the substrate 100. During the formation of the second source/drain pattern SD2, the second source/drain pattern SD2 may be doped in-situ with p-type impurities (e.g., boron, gallium, or indium). Alternatively, impurities may be injected into the second source/drain pattern SD2, after the formation of the second source/drain pattern SD2.

Figure 11A:
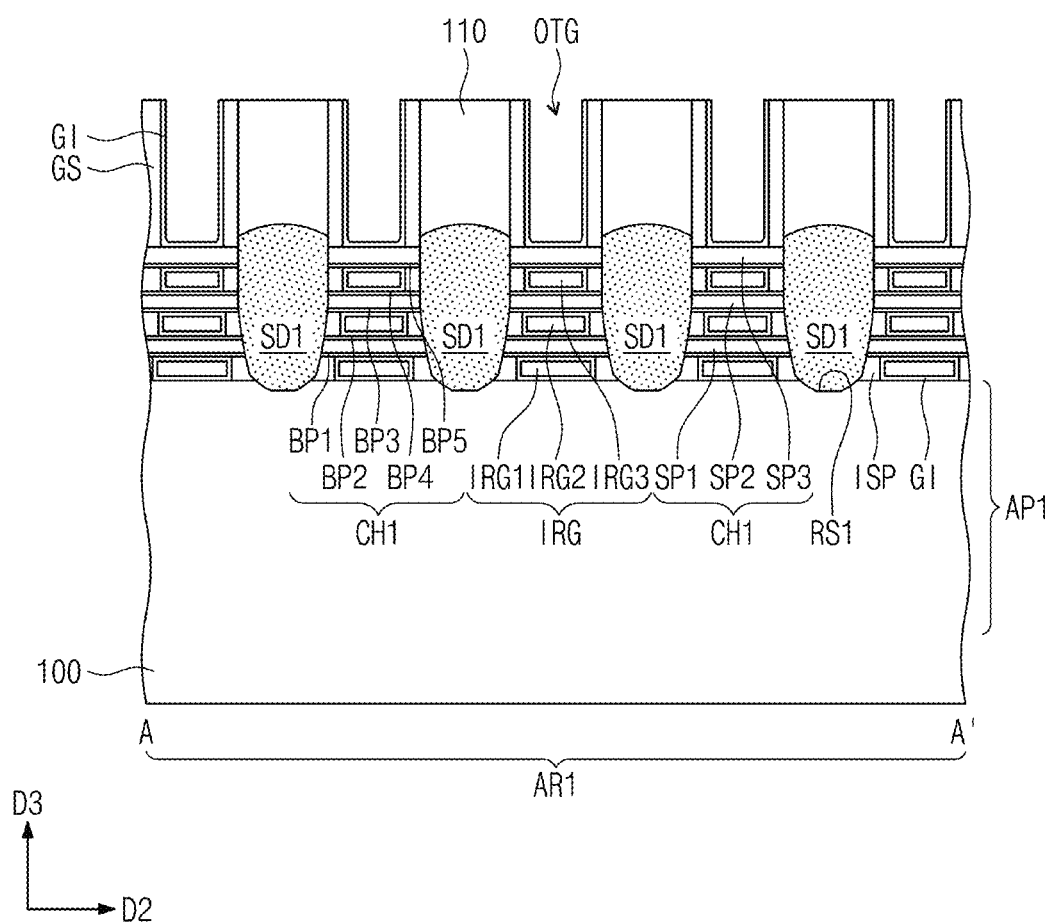
Figure 11B:
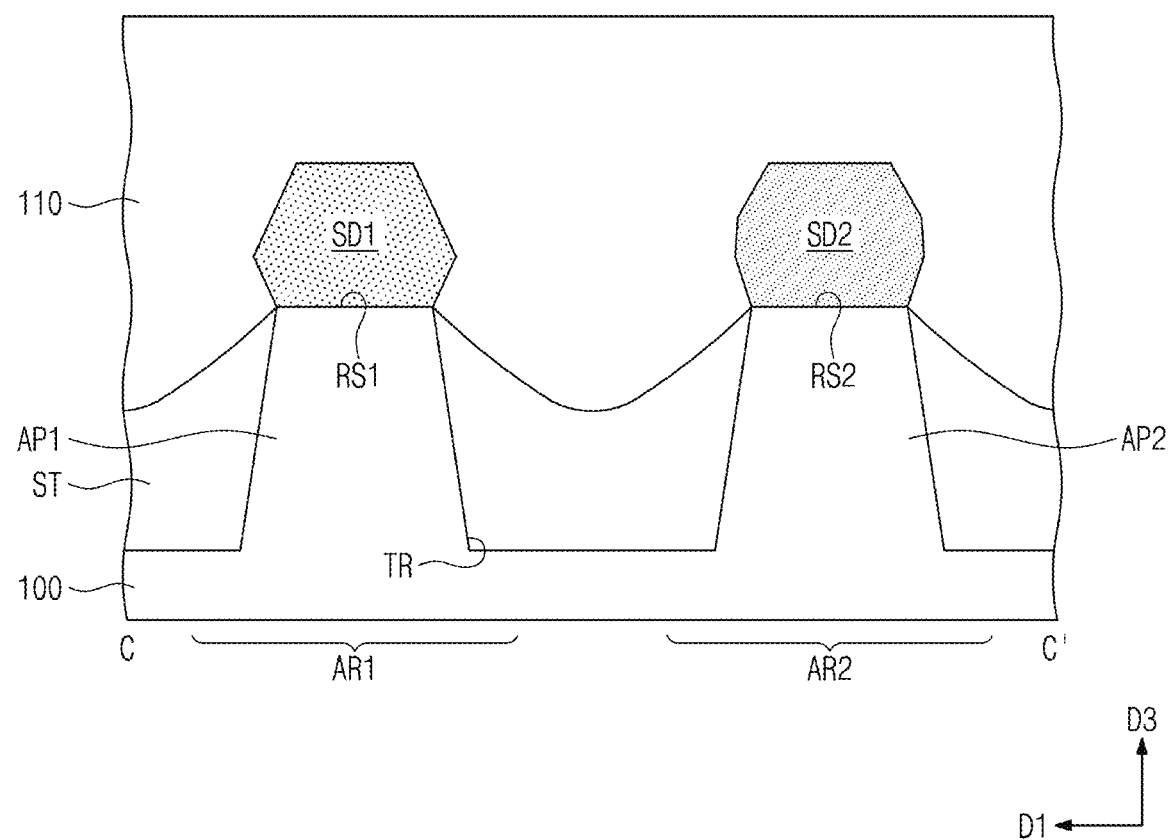
Figure 11C:
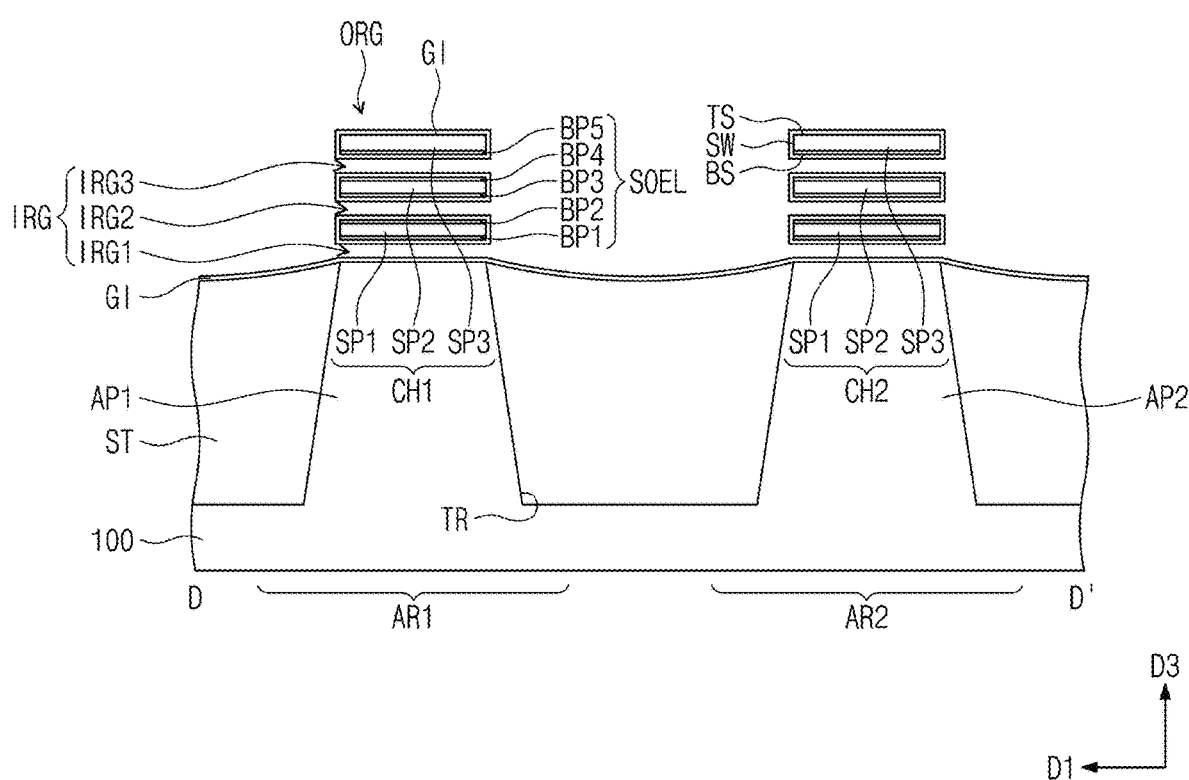

Referring to FIGS. 11A to 11C, the first interlayer insulating layer 110 may be formed to cover the first and second source/drain patterns SD1 and SD2, the hard mask patterns MP, and the gate spacers GS. In an embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, the first interlayered insulating layer 110 may have a top surface that is substantially coplanar the top surfaces of the sacrificial patterns PP and the top surfaces of the gate spacers GS.

The exposed sacrificial patterns PP may be selectively removed. As a result of the removal of the sacrificial patterns PP, an outer region ORG exposing the first and second channel patterns CH1 and CH2 may be formed (e.g., see FIG. 11C). The removal of the sacrificial patterns PP may include a wet etching process which is performed using etching solution capable of selectively etching polysilicon.

The sacrificial layers SAL exposed through the outer region ORG may be selectively removed to form inner regions IRG (e.g., see FIG. 11C). In detail, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %. Since, due to the barrier patterns BP1 to BP5, the process time for removing the sacrificial layer SAL is reduced, it may be possible to improve process efficiency in a process of removing only the sacrificial layers SAL.

Since the process time for removing the sacrificial layer SAL is reduced, it may be possible to prevent the source/drain pattern SD1 or SD2 from being etched. For example, it may be possible to prevent a short circuit (e.g., a PC-to-eSiGe short) between the gate and the source/drain and thereby to improve electrical characteristics of the device. Furthermore, due to the increase of the etch selectivity, it may be possible to reduce an amount of the sacrificial layer SAL, which is left on the surface of the barrier pattern BP1-BP5, after the etching process. Accordingly, it may be possible to uniformly form the gate insulating layer and the high-k dielectric layer in the process of forming the gate electrode. That is, it may be possible to improve reliability and electric characteristics of the semiconductor device.

During the etching process, the sacrificial layers SAL on the first and second active regions AR1 and AR2 may be removed. The etching process may be a wet etching process. An etchant material, which is used in the etching process, may be chosen to quickly remove the sacrificial layer SAL having a relatively high germanium concentration.

Referring back to FIG. 11C, since the sacrificial layers SAL are selectively removed, only the stacked first to third semiconductor patterns SP1, SP2, and SP3 and the stacked first to fifth barrier patterns BP1, BP2, BP3, BP4, and BP5 may be left on each of the first and second active patterns AP1 and AP2. Empty regions, which are formed by removing the sacrificial layers SAL, may form first to third inner regions IRG1, IRG2, and IRG3, respectively.

In detail, the first inner region IRG1 may be formed between the active pattern AP1 or AP2 and the first barrier pattern BP1, the second inner region IRG2 may be formed between the second barrier pattern BP2 and the third barrier pattern BP3, and the third inner region IRG3 may be formed between the fourth semiconductor pattern BP4 and the fifth barrier pattern BP5.

Referring back to FIGS. 11A to 11C, the gate insulating layer GI may be formed on the exposed surfaces of the first to third semiconductor patterns SP1, SP2, and SP3 and the first to fifth barrier patterns BP1, BP2, BP3, BP4, and BP5. The gate insulating layer GI may be formed to enclose each of the first to third semiconductor patterns SP1, SP2, and SP3 and the first to fifth barrier patterns BP1, BP2, BP3, BP4, and BP5. The gate insulating layer GI may be formed in each of the first to third inner regions IRG1, IRG2, and IRG3. The gate insulating layer GI may be formed in the outer region ORG.

Figure 12A:
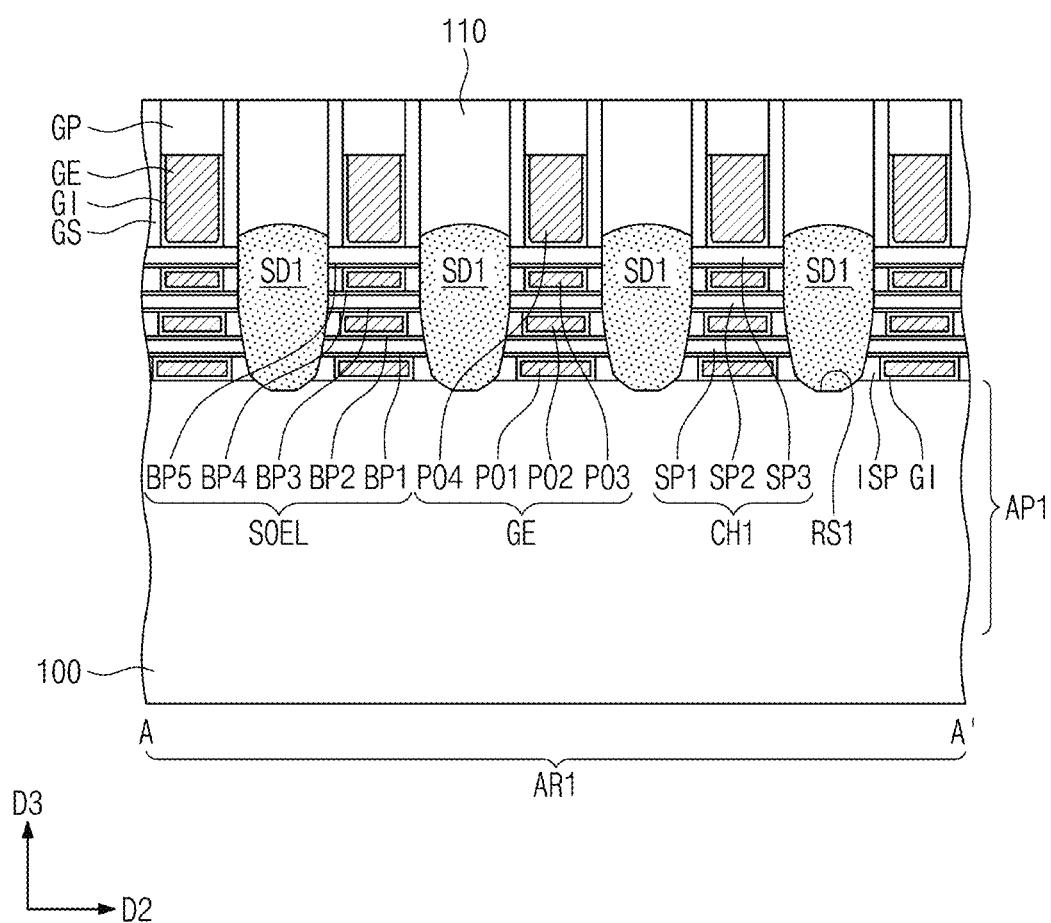
Figure 12B:
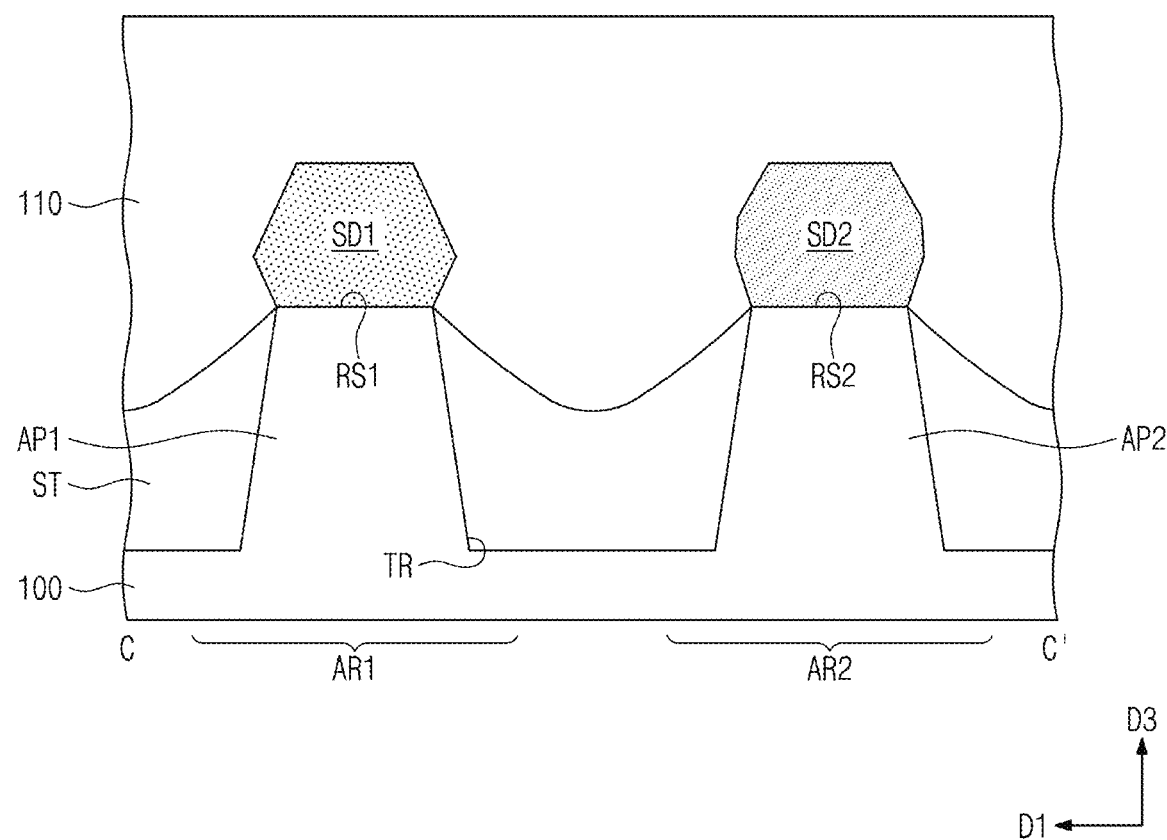
Figure 12C:
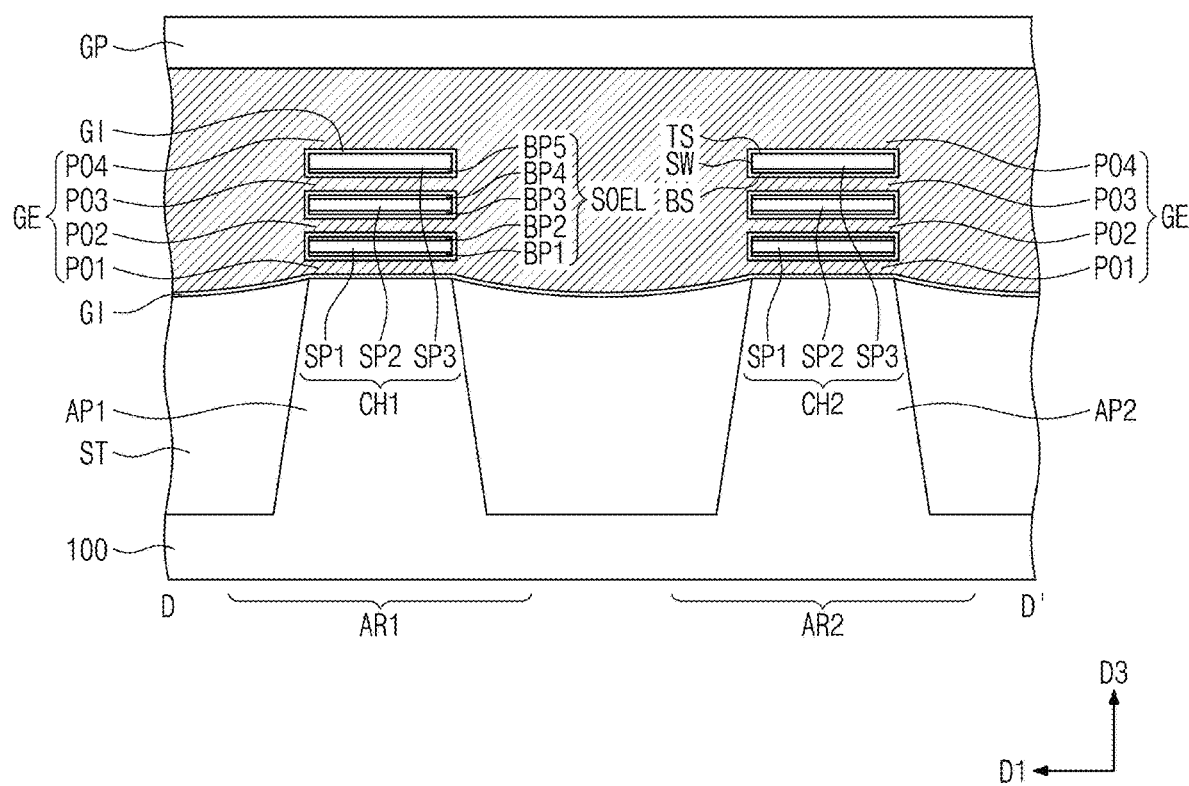

Referring to FIGS. 12A to 12C, the gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG. The gate electrode GE may be vertically recessed to have a reduced height. The gate capping pattern GP may be formed on the recessed gate electrode GE.

Referring back to FIGS. 5A to 5D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

The division structures DB may be respectively formed on the first and second borders BD1 and BD2 of the single height cell SHC. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

In a three-dimensional field effect transistor according to an embodiment of the inventive concept, a single-crystalline epitaxial layer may be used as a barrier pattern, and thus, it may be possible to prevent diffusion of dopants or Ge atoms. Furthermore, the barrier pattern may have an increased etching selectivity in dry and wet etching processes, and thus, the use of the barrier pattern may make it possible to improve electrical and reliability characteristics of the semiconductor device. In addition, by using the barrier pattern in a process of forming a gate insulating layer and a gate electrode, it may be possible to improve process efficiency.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   a substrate including an active pattern;
   a channel pattern on the active pattern, the channel pattern comprising a plurality of semiconductor patterns, which are vertically stacked to be spaced apart from each other;
   a source/drain pattern connected to the plurality of semiconductor patterns;
   a gate electrode including a plurality of gate electrode portions, a gate electrode portion interposed between adjacent ones of the semiconductor patterns; and
   a plurality of barrier patterns each comprising an epitaxial layer including single-crystalline silicon oxide,
   wherein a barrier pattern is interposed between each of the adjacent ones of the semiconductor patterns and a respective gate electrode portion.

2. The semiconductor device of claim 1, wherein an oxygen concentration of the silicon oxide has a value selected from a range between 7.0E18 atoms/cm$^3$ and 1.3E19 atoms/cm$^3$.

3. The semiconductor device of claim 1, wherein, in each of the barrier patterns, silicon and oxygen atoms are alternately arranged to form a lattice structure.

4. The semiconductor device of claim 1, wherein the barrier pattern comprises a plurality of stacks which are horizontally disposed to be spaced apart from each other, and
   in each of the stacks, silicon and oxygen atoms are alternately arranged to form a lattice structure.

5. The semiconductor device of claim 1, wherein each of the plurality of barrier patterns is provided in the form of a uniform single layer.

6. The semiconductor device of claim 1, further comprising a gate insulating layer between the respective barrier pattern and the respective gate electrode portion,
   wherein each of the plurality of barrier patterns comprise crystalline silicon oxide, and
   the gate insulating layer comprises amorphous silicon oxide.

7. The semiconductor device of claim 1, wherein none of the plurality of barrier patterns are disposed between an uppermost one of the semiconductor patterns and a gate electrode disposed on the uppermost one of the semiconductor patterns.

8. The semiconductor device of claim 1, wherein a width of each of the plurality of barrier patterns is greater than a width of the gate electrode portion interposed between adjacent ones of the semiconductor patterns.

9. A semiconductor device, comprising: a substrate including an active pattern; a channel pattern on the active pattern, the channel pattern comprising a plurality of semiconductor patterns, which are vertically stacked to be spaced apart from each other; a source/drain pattern connected to the plurality of semiconductor patterns; a gate electrode including a plurality of gate electrode portions, a gate electrode portion interposed between adjacent ones of the semiconductor patterns; and a plurality of barrier patterns each comprising an epitaxial layer including single-crystalline silicon oxide, wherein a barrier pattern is interposed between each of the adjacent ones of the semiconductor patterns and a respective gate electrode portion, wherein an oxygen concentration of the silicon oxide has a value selected from a range between 7.0E18 atoms/cm3 and 1.3E19 atoms/cm3, and wherein a thickness of each of the plurality of barrier patterns has a value selected from a range between 30 A and 40 A.

10. The semiconductor device of claim 9, wherein, in each of the plurality of barrier patterns, silicon and oxygen atoms are alternately arranged to form a lattice structure.

11. The semiconductor device of claim 9, wherein the barrier pattern comprises a plurality of stacks which are horizontally disposed to be spaced apart from each other,
    in each of the stacks, silicon and oxygen atoms are alternately arranged to form a lattice structure, and
    the thickness of the barrier pattern is equal to a thickness of each of the stacks.

12. The semiconductor device of claim 9, wherein each of the plurality of barrier patterns is provided in the forming of a uniform single layer.

13. The semiconductor device of claim 9, further comprising a gate insulating layer between the respective barrier pattern and the respective gate electrode portion,
    wherein each of the plurality of barrier patterns comprise crystalline silicon oxide, and
    the gate insulating layer comprises amorphous silicon oxide.

14. The semiconductor device of claim 9, wherein none of the plurality of barrier patterns are disposed between an uppermost one of the semiconductor patterns, and a gate electrode disposed on the uppermost one of the semiconductor patterns.

15. The semiconductor device of claim 9, wherein a width of the each of the plurality of barrier patterns is greater than a width of the gate electrode portion interposed between adjacent ones of the semiconductor patterns.

16. The semiconductor device of claim 15, wherein the plurality of barrier patterns are adjacent to the source/drain pattern.

17. A semiconductor device, comprising:
    a substrate including an active region;
    a device isolation layer defining an active pattern on the active region;
    a channel pattern and a source/drain pattern on the active pattern, the channel pattern comprising a plurality of semiconductor patterns, which are vertically stacked to be spaced apart from each other;
    a gate electrode on the semiconductor patterns, the gate electrode comprising a first portion, which is provided below the uppermost one of the semiconductor patterns, and a second portion, which is provided on the uppermost one of the semiconductor patterns;
    a first barrier pattern between the uppermost one of the semiconductor patterns and the first portion;

a gate insulating layer between the uppermost one of the semiconductor patterns and the second portion;

an inner spacer between the first portion and the source/drain pattern;

a gate spacer on a side surface of the second portion;

a gate capping pattern on a top surface of the gate electrode;

an interlayer insulating layer on the gate capping pattern;

an active contact provided to penetrate the interlayer insulating layer and electrically connected to the source/drain pattern;

a metal-semiconductor compound layer interposed between the active contact and the source/drain pattern;

a gate contact provided to penetrate the interlayer insulating layer and the gate capping pattern and electrically connected to the gate electrode;

a first metal layer on the interlayer insulating layer, the first metal layer comprising first interconnection lines, which are electrically and respectively connected to the active and gate contacts, and a power line; and a second metal layer on the first metal layer, wherein the second metal layer comprises second interconnection lines electrically connected to the first metal layer, the first barrier pattern comprises single-crystalline silicon oxide, and the gate insulating layer comprises amorphous silicon oxide.

18. The semiconductor device of claim 17, wherein an oxygen concentration of the silicon oxide, which is included in the first barrier pattern, has a value selected from a range between 7.0E18 atoms/cm$^3$ and 1.3E19 atoms/cm$^3$.

19. The semiconductor device of claim 17, wherein a thickness of the first barrier pattern has a value selected from a range between 30 Å and 40 Å.

20. The semiconductor device of claim 17, further comprising:

a second barrier pattern, a third barrier pattern, a fourth barrier pattern, and a fifth barrier pattern, which are vertically overlapped with each other, and a width of each of the first to fifth barrier patterns in a first direction increases as a downward distance to the substrate decreases.

* * * * *